US012672522B2

(12) United States Patent
Hsu et al.

(10) Patent No.: US 12,672,522 B2
(45) Date of Patent: Jun. 30, 2026

(54) SEMICONDUCTOR DEVICE AND METHOD OF TESTING THE SAME

(71) Applicant: TAIWAN SEMICONDUCTOR MANUFACTURING COMPANY LTD., Hsinchu (TW)

(72) Inventors: Ruei-Jyun Hsu, Hsinchu City (TW); Wei Wang, Taipei City (TW); Wei-Jen Chang, Miaoli County (TW); Chung-Shi Chiang, Hsinchu County (TW); Chia-Chi Ho, Hsinchu County (TW); Hsin-Shan Liu, Changhua County (TW); Chang-Hung Yu, Taipei City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 528 days.

(21) Appl. No.: 18/311,220

(22) Filed: May 2, 2023

(65) Prior Publication Data

US 2024/0371709 A1     Nov. 7, 2024

(51) Int. Cl.
| | |
|---|---|
| *H10P 74/00* | (2026.01) |
| *H10D 30/01* | (2025.01) |
| *H10D 30/47* | (2025.01) |
| *H10D 62/10* | (2025.01) |
| *H10W 20/42* | (2026.01) |
| *H10W 42/00* | (2026.01) |
| *H10W 74/10* | (2026.01) |

(52) U.S. Cl.
CPC ......... *H10P 74/273* (2026.01); *H10D 30/015* (2025.01); *H10D 30/475* (2025.01); *H10D 62/127* (2025.01); *H10W 20/42* (2026.01); *H10W 42/00* (2026.01); *H10W 74/137* (2026.01)

(58) Field of Classification Search
None
See application file for complete search history.

(56) References Cited

U.S. PATENT DOCUMENTS

2022/0005733 A1* 1/2022 Jeong ..................... H10P 54/00

* cited by examiner

*Primary Examiner* — Reema Patel
(74) *Attorney, Agent, or Firm* — WPAT LAW; Anthony King

(57) ABSTRACT

The present disclosure provides a semiconductor device. The semiconductor device includes: a substrate including a transistor, wherein the semiconductor device is surrounded by a seal ring; an interconnect structure over the transistor; a recess on a sidewall of the seal ring; a test pad in the interconnect structure, wherein the test pad extends from the interconnect structure to the recess of the seal ring.

20 Claims, 20 Drawing Sheets

SEMICONDUCTOR DEVICE AND METHOD OF TESTING THE SAME

BACKGROUND

In integrated circuit (IC) manufacturing, testing is a key step to ensure the functionality of a semiconductor device.

In semiconductor fabrication, a wafer typically undergoes numerous processes to form an IC. Various wafer-level tests are performed to determine performance and reliability of the IC under various conditions and wafer acceptance testing (WAT). Wafer-level reliability testing is utilized for detecting early life failure associated with defects generated during fabrication of the IC. However, so far some semiconductor devices such as a high-electron-mobility transistor (HEMT) may still need artificial measurements to ensure the reliability of such semiconductor devices. Therefore, there is a need to improve the wafer-level reliability testing.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
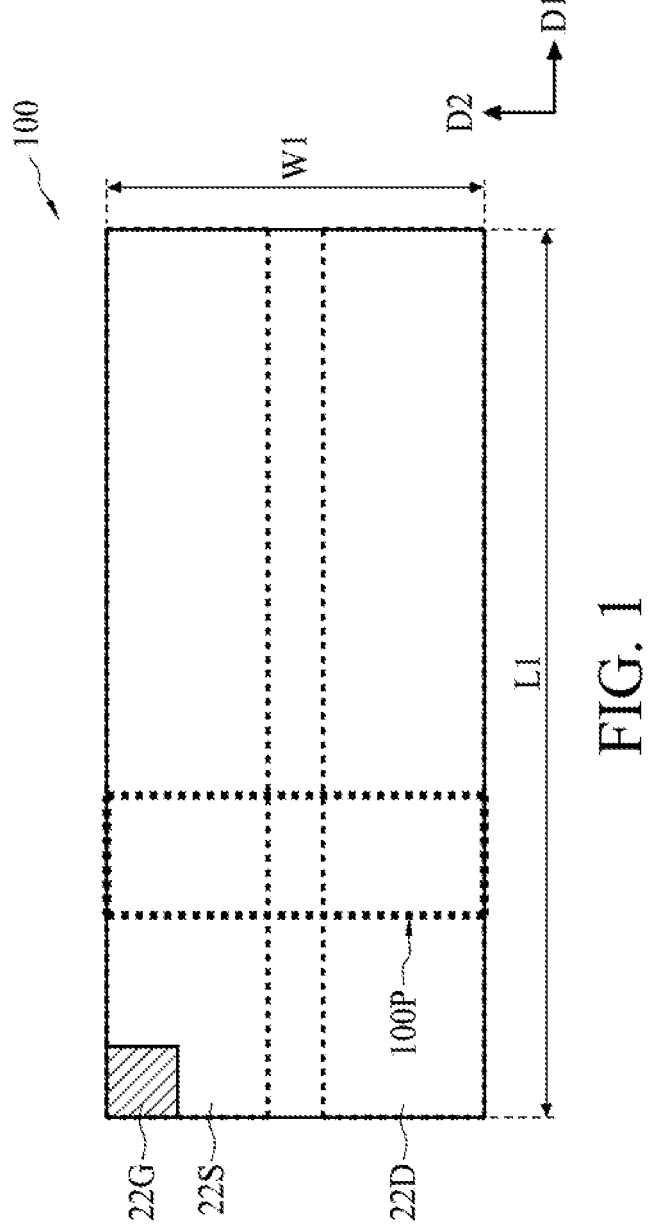
FIG. 1 is a schematic top view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass orientations of the device in use or operation in some embodiments different from the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A High-electron-mobility transistor (HEMT), also known as hetero-structure FET (HFET) or modulation-doped FET (MODFET) incorporates a junction between two materials with different band gaps (i.e. a heterojunction) as a channel instead of a doped region as in most of metal-oxide-semiconductor field-effect transistor (MOSFET). HEMT devices are capable of operating at high frequencies up to millimeter wave frequencies, and are used in high-frequency products. A HEMT device commonly uses materials combination that employs III-V compound semiconductors. Compound semiconductors such as gallium arsenide (GaAs), aluminum gallium arsenide (AlGaAs), gallium nitride (GaN), or aluminum gallium nitride (AlGaN) can be used as the junction in the channel of the HEMT device.

In some HEMT devices, a wide bandgap AlGaN layer can form a heterojunction with a narrow bandgap GaN layer. The lattice constants of these two materials are typically slightly different. The difference in the lattice structures of these types of materials produces a strain that can result in polarization and form band bending at the heterojunction interface. For example, a GaN HEMT device typically has a strong surface polarization that causes it to operate with normally-on (depletion-mode) status. To overcome the surface polarization and control the flow of charge carriers in an enhancement mode device, a gate having a p-GaN material with a high work function can be formed directly on top of the AlGaN layer.

FIG. 1 is a schematic top view of a semiconductor device 100 in accordance with some embodiments of the present disclosure. In some embodiments, the semiconductor device 100 is a HEMT device. The semiconductor device 100 may have a length L1 along a first direction D1 and a width W1 along a second direction D2 perpendicular to the first direction D1. In some embodiments, the length L1 is between about 2000 micrometers ($\mu$m) and about 400 $\mu$m and the width W1 is between about 300 $\mu$m and about 500 $\mu$m. The semiconductor device 100 includes a gate region 20G reserved for a gate pad, a source region 20S reserved for a source pad and a drain region 20D reserved for a drain pad. The gate pad, the source pad and the drain pad will be formed in subsequent operations. In some embodiments, the source region 20S is adjacent to and parallel with the drain region 20D. The source region 20S and the drain region 20D may extend along the first direction D1. In some embodiments, the gate region 20G is disposed at a corner of the top surface of the semiconductor device 100 and at least partially surrounded by the source region 20S. Source/drain region(s) may refer to a source or a drain, individually or collectively dependent upon the context.

Figure 2:
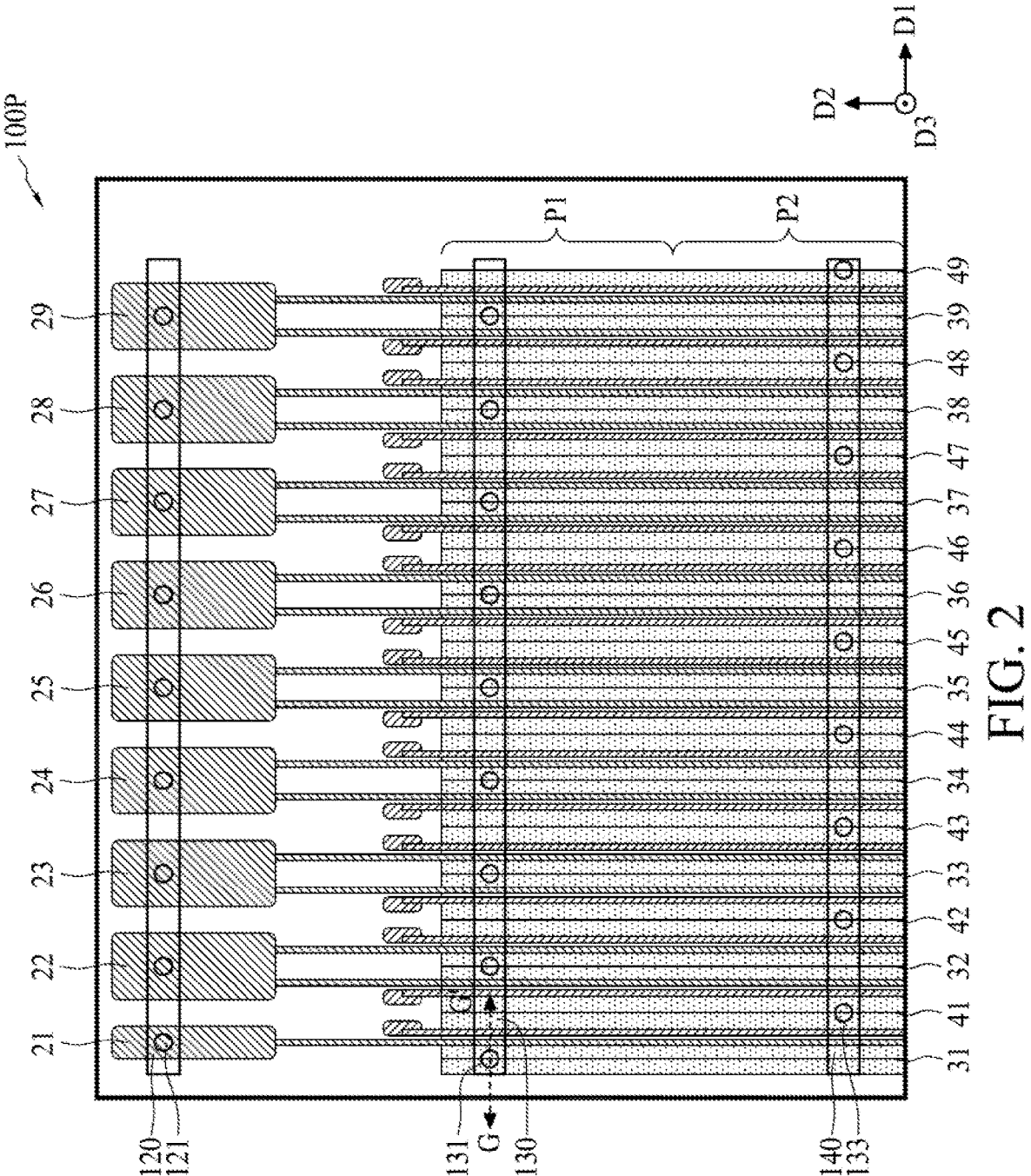
FIG. 2 is a schematic top view of an area of a semiconductor structure of the semiconductor device in FIG. 1, in accordance with some embodiments of the present disclosure.

FIG. 2 is a schematic top view of an area 100P of the semiconductor device 100 at a level of gate, source and drain electrodes within the semiconductor device 100. In some embodiments, the semiconductor device 100 includes 500 to 1000 gate electrodes and FIG. 2 only shows a subset of the gate electrodes, e.g., gate electrodes 21 to 29 in the area 100P as an example. The semiconductor device 100 may have as many source electrodes as the gate electrodes and as many drain electrodes as the gate electrodes. FIG. 2 only shows a subset of the source electrodes, e.g., source electrodes 31 to 39, and a subset of the drain electrodes, e.g., drain electrodes 41 to 49 as an example. In some embodiments, the source electrodes 31 to 39 and the drain electrodes 41 to 49 are alternately arranged. The gate electrodes 21 to 29 may be connected in parallel with each other. As shown in FIG. 2, the gate electrodes 21 to 29, the source electrodes 31 to 39 and the drain electrodes 41 to 49 extend along the second direction D2. The source electrodes 31 to 39 and the drain electrodes 41 to 49 can be divided into an upper region P1 and a lower region P2 adjacent to the upper region P1. In some embodiments, the source electrodes 31 to 39 are configured to transmit signals through the upper region P1, and the drain electrodes 41 to 49 are configured to transmit signals through the lower region P2. The signals respectively transmitted through the gate electrodes 21 to 29 may be electrically coupled together to the gate region 20G. The signals respectively transmitted through the source electrodes 31 to 39 may be electrically coupled together to the source region 20S. The signals respectively transmitted through the drain electrodes 41 to 49 may be electrically coupled together to the drain region 20D.

Figure 3:
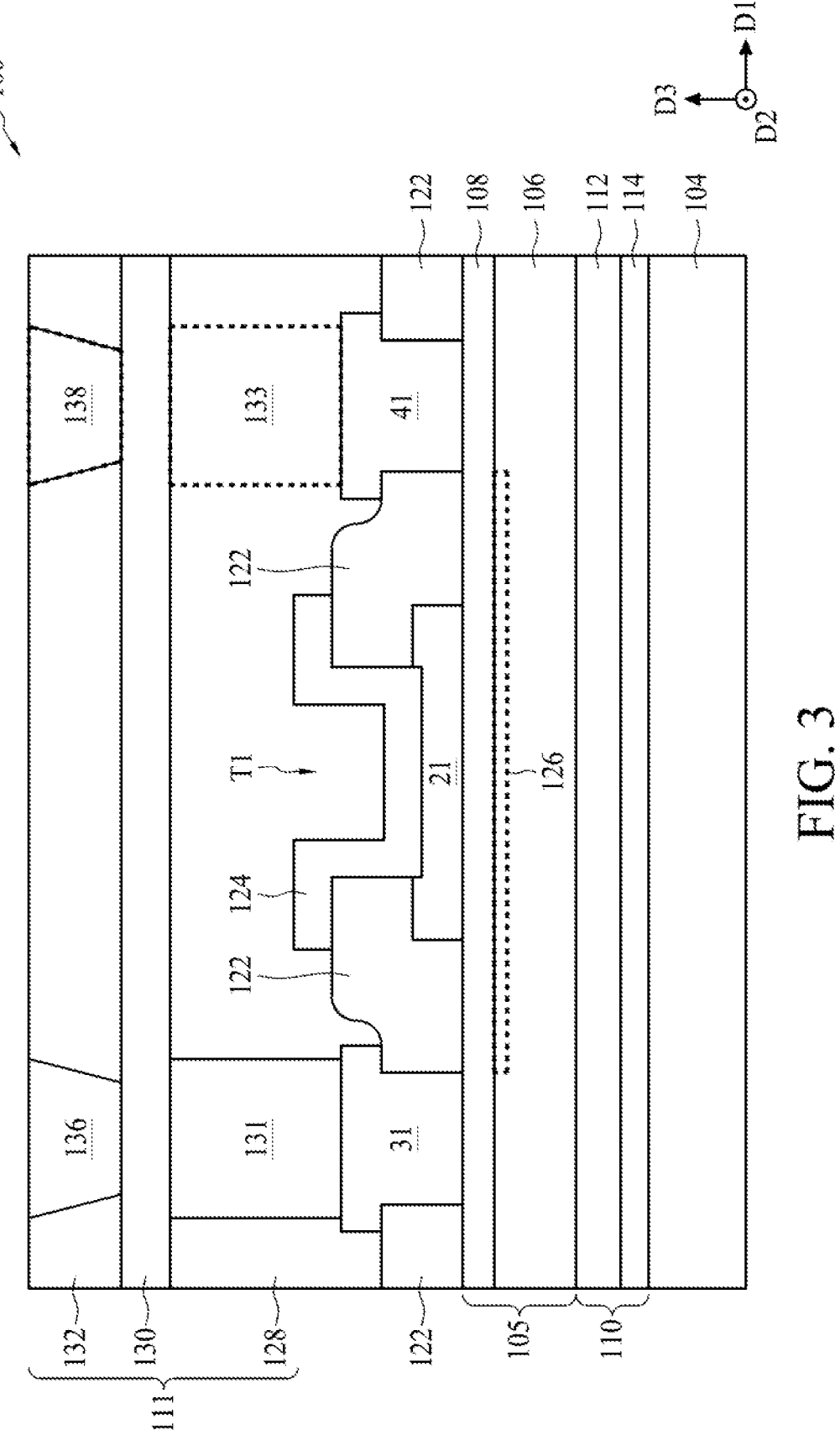
FIG. 3 is a schematic cross-sectional view of the semiconductor structure in FIG. 2 along a cross-sectional line G-G' in FIG. 2.

FIG. 3 is a schematic cross-sectional view of the along the cross-sectional line G-G' in FIG. 2. The semiconductor device 100 is a portion of the semiconductor device 100 in FIG. 1. The semiconductor device 100 may include a transistor T1 including the gate electrode 21, the source electrode 31 and the drain electrode 41 shown in FIG. 2. The semiconductor device 100 includes a heterojunction structure 105 arranged over a substrate 104. The substrate 104 may be formed of a semiconductor material, such as silicon, germanium, silicon germanium, or the like. The heterojunction structure 105 is made up of a binary III/V semiconductor layer 106, and a ternary III/V semiconductor layer 108 arranged over the binary III/V semiconductor layer 106. The ternary III/V semiconductor layer 108 is made of a second III-nitride layer and acts as a barrier layer, which is similar to a gate dielectric for an ordinary MOSFET. In some embodiments, the binary III/V semiconductor layer 106 is made of gallium nitride (GaN), and the ternary III/V semiconductor layer 108 is made of aluminum gallium nitride (AlxGa$_{1-x}$N, where x is between 1 and 0).

One or more buffer layers 110 can be arranged between the heterojunction structure 105 and the substrate 104. These buffer layers 110 can help gradually distribute strain over their thickness, wherein the strain is due to lattice mismatch between the substrate 104 and the binary III/V semiconductor layer 106. By distributing strain, these buffer layers 110 can help ward off trap formation in some regards. The illustrated buffer layers 110 include an uppermost buffer layer 112 abutting the binary III/V semiconductor layer 106, as well as a lower buffer layer 114 between the upper buffer layer 112 and the substrate 104. The uppermost buffer layer 112 can be made of AlGaN, and the lower buffer layer 114 can be made of AlN. In some embodiments, more than two buffer layers can be included between the heterojunction structure 105 and substrate 104.

The source/drain electrodes 31, 41 are arranged over the ternary III/V semiconductor layer 108 and spaced apart laterally from one another. The source/drain electrodes 31, 41 have respective lower regions which abut the ternary III/V semiconductor layer 108 and are electrically coupled to the ternary III/V semiconductor layer 108. In some embodiments, the source electrode 31 and the drain electrode 41 rest directly on and abut the ternary III/V semiconductor layer 108 and are spaced apart from the binary III/V semiconductor layer 106. However, in some other embodiments, the source/drain electrodes 31, 41 extend through the ternary III/V semiconductor layer 108 and abut the binary III/V semiconductor layer 106.

The gate electrode 21 is arranged over the heterojunction structure 105 and is arranged laterally between the source and drain electrodes 31, 41. The gate electrode 21 is made of a third III-nitride material. For example, in some embodiments, the gate electrode 21 can be made of GaN, which is doped with donor impurities to form an n-type gate structure or which is doped with acceptor impurities to form a p-type gate structure. These dopants help the resultant semiconductor device 100 to operate in enhancement mode as opposed to depletion mode.

A passivation layer 122 is conformally disposed on sidewalls of the gate electrode 21 and partially over the gate electrode 21. The passivation layer 122 is also disposed over an upper surface of the ternary III/V barrier semiconductor layer 108. This passivation layer 122, which can be made of aluminum nitride (AlN) or boron nitride (BN) in some embodiments, can be a high quality thin film to prevent current leakage from the gate electrode 21. Thus, in some embodiments, the passivation layer 122 is grown by atomic layer deposition (ALD) techniques.

In some embodiments, the source/drain electrodes 31, 41 extend downward through the passivation layer 122 to electrically couple to the ternary III/V semiconductor layer 108. The source/drain electrodes 31, 41 can be formed of metals, such as copper (Cu), aluminum (Al), tungsten (W), nickel (Ni), iron (Fe), cobalt (Co), silver (Ag), gold (Au), platinum (Pt), or alloys thereof, for example.

In some embodiments, a dielectric capping layer (not shown) conformally overlies the conductive source/drain electrodes 31, 41. The conformal dielectric capping layer may be a nitride (e.g., SiN) or an oxide (e.g., SiO₂), for example.

A metal electrode contact 124 extends downward through the first passivation layer 122 to form an ohmic connection to the gate electrode 21. In some embodiments the metal electrode contact 124 is formed by physical vapor deposition (PVD) or chemical vapor deposition (CVD). The metal electrode contact 124 can extend downwardly along sidewalls of the passivation layer 122 before electrically contacting an upper surface region of the gate electrode 21.

Due to a difference in bandgaps between the binary III/V semiconductor layer 106 and ternary III/V layer 108, highly mobile charge carriers are established in the form of a two-dimensional electron gas (2 DEG) 126 at the interface between layers 106, 108. Hence, during operation, a voltage applied to the gate electrode 21 controls the number of carriers (e.g., 2 DEG) that can flow from the source electrode 31 to the drain electrode 41, or vice versa, through a channel region in the binary III/V semiconductor layer 106. Thus, whether the semiconductor device 100 is in a conductive or resistive state can be controlled by controlling the 2 DEG 126 with the help of the gate electrode 21. In some cases, the semiconductor device 100 is an enhancement mode device, which operates in a manner similar to silicon MOSFET devices by normally being in a non-conducting state (normally off). In some embodiments, due to the nature of the heterojunction interface between 106/108, and the formation of the 2 DEG 126 at this heterojunction interface in HEMTs, such devices that are formed in the III-N materials system tend to be normally on, or depletion mode devices. That is, the high electron mobility of the 2 DEG 126 at the interface of the AlGaN/GaN layers permits the III-N device, such as a HEMT device, to conduct without the application of a gate potential.

An interconnect structure 111 is disposed over the transistor T1. The interconnect structure 111 may include a plurality of connected conductive features embedded in a dielectric material. An interlayer dielectric (ILD) 128 is disposed on the source/drain electrodes 31, 41, the passivation layer 122 and the metal electrode contact 124. In some embodiments, the ILD 128 includes a dielectric material such as silicon oxide, silicon nitride, a low dielectric constant (low k) material, or a combination thereof.

Referring to FIGS. 2 and 3, a source contact 131 and a drain contact 133 are disposed on and electrically coupled to the source electrode 31 and the drain electrode 41, respectively. The drain contact 133 may not be shown in the cross-sectional view of FIG. 3, and thus is illustrated with dashed lines. The source contact 131 and the drain contact 133 may extend through the ILD 128. The representative source contact 131 and other source contacts respectively disposed on the source electrodes 32 to 39 may be electrically coupled to a metal line 130 over the source contacts. In some embodiments, the source contacts 131 are disposed in the upper region P1 only. The representative drain contact 133 and other drain contacts respectively disposed on the drain electrodes 42 to 49 may be electrically coupled to a metal line 140 over the drain contacts. In some embodiments, the drain contacts are disposed in the lower region P2 only. The metal line 140 may not be shown in the cross-sectional view of FIG. 3, and thus is illustrated with dashed lines. An inter-metal dielectric (IMD) 132 is disposed on the metal lines 130 and 140. The IMD 132 may include the same or a similar material to that of the ILD 128.

A plurality of conductive vias are disposed on and electrically coupled to the metal line 130. A first conductive via 136 may be vertically disposed over the source contact 131 and a second conductive via 138 may be vertically disposed over the drain contact 133. The second conductive via 138 may not be shown in the cross-sectional view of FIG. 3, and thus is illustrated with dashed lines. The conductive vias 136, 138 may be surrounded by the IMD 132. The first conductive via 136, the source contact 131 and the source electrode 31 may be arranged along a third direction D3 both perpendicular to the first direction D1 and the second direction D2. The second conductive via 138, the drain contact 133 and the drain electrode 41 may be arranged along the third direction D3.

In some embodiments, referring to FIG. 2, the gate electrode 21 and the metal electrode contact 124 extend along the second direction D2 and electrically coupled to a gate contact 121. The gate contact 121 and other gate contacts respectively disposed on the gate electrodes 22 to 29 may be electrically coupled to a metal line 120 over the gate contacts 121. The metal lines 120, 130 and 140 may extend along the first direction D1. The metal lines 120, 130 and 140 may be arranged at the same level and included in the first metal (M1) layer over the transistor 11. It is understood that the semiconductor device 100 may undergo further processing to form various features such as contacts/vias, interconnect metal lines, interlayer dielectric, passivation layers, etc. to form a complete circuit.

Figure 4:
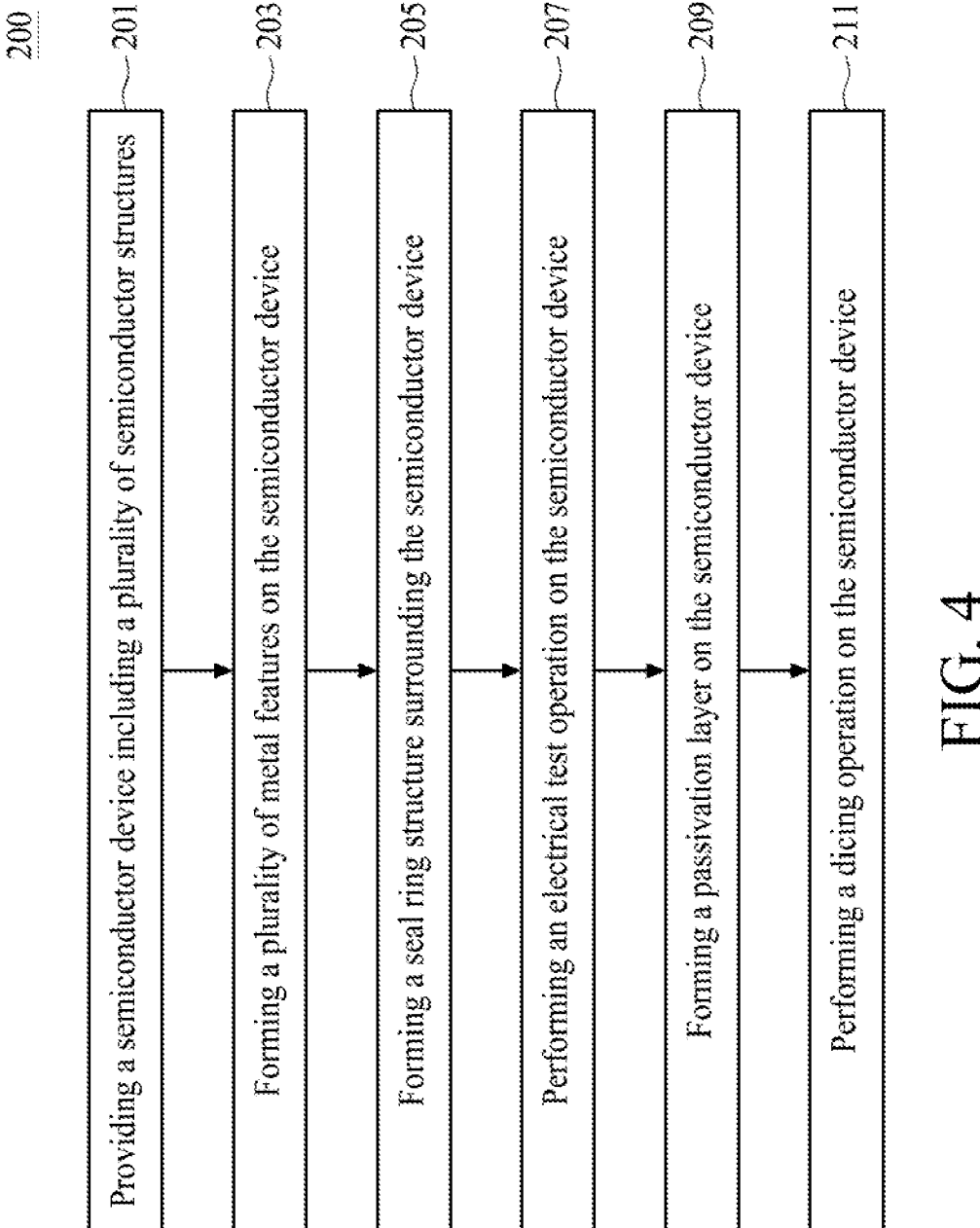
FIG. 4 is a flow diagram showing a method for fabricating and testing a semiconductor device, in accordance with some embodiments of the present disclosure.

FIG. 4 is a flow diagram showing a test method 200 for testing a semiconductor device according to various embodiments of the present disclosure. The method 200 can be implemented to power the semiconductor device in a wafer-level test. The wafer level test includes electrically testing the semiconductor device while it is still in wafer form.

In operation 201, the semiconductor device 100 of FIGS. 1 to 3 which includes a plurality of semiconductor structures is provided. As mentioned above, the semiconductor device 100 includes various types of circuits formed thereon. A wafer undergoes numerous semiconductor fabrication processes known in the art to form the semiconductor device 100.

Figure 5:
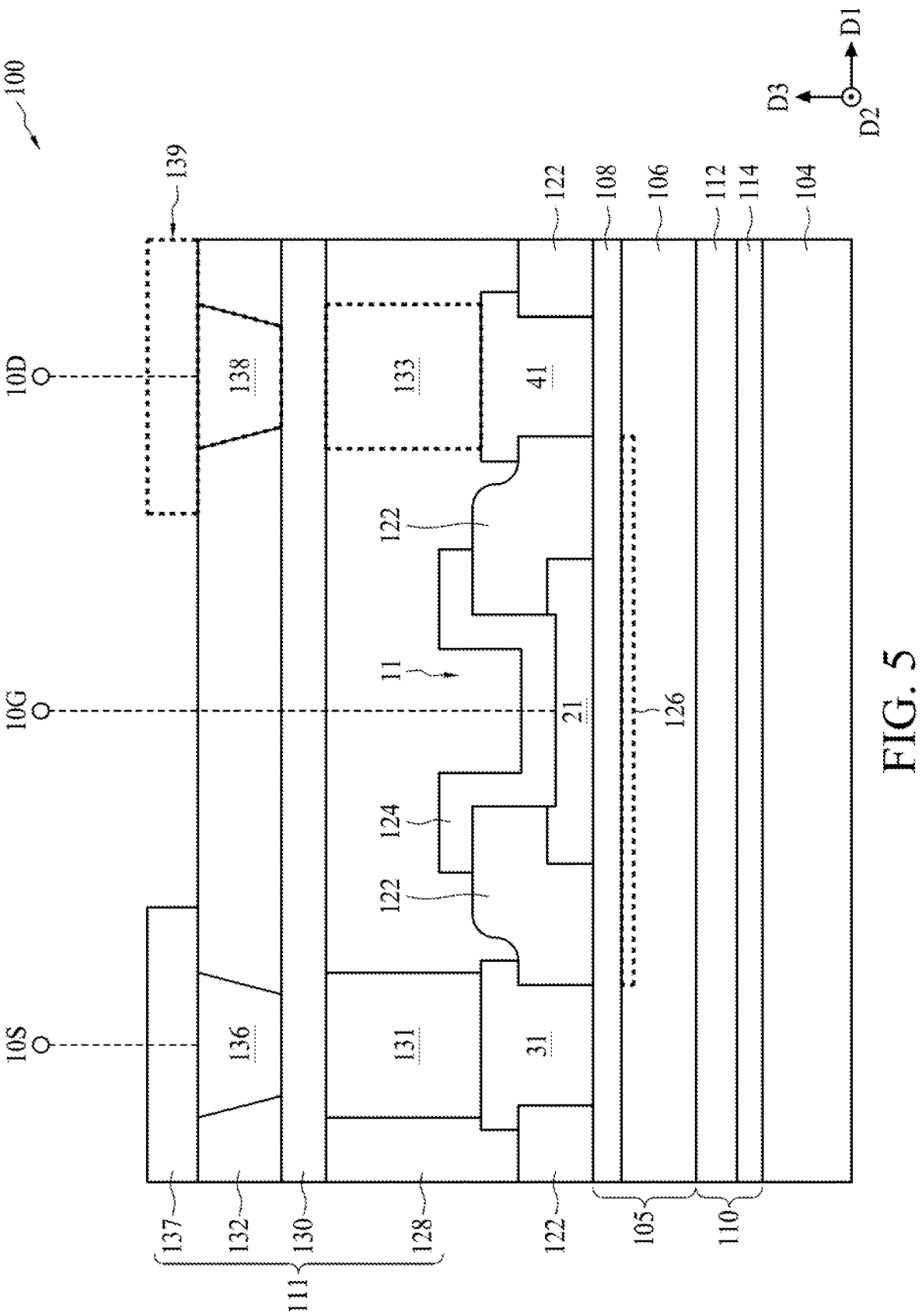
FIGS. 5 to 8 are schematic cross-sectional and perspective views illustrating sequential fabrication stages of the semiconductor device formed using the method of FIG. 4, in accordance with some embodiments of the present disclosure.
Figure 6:
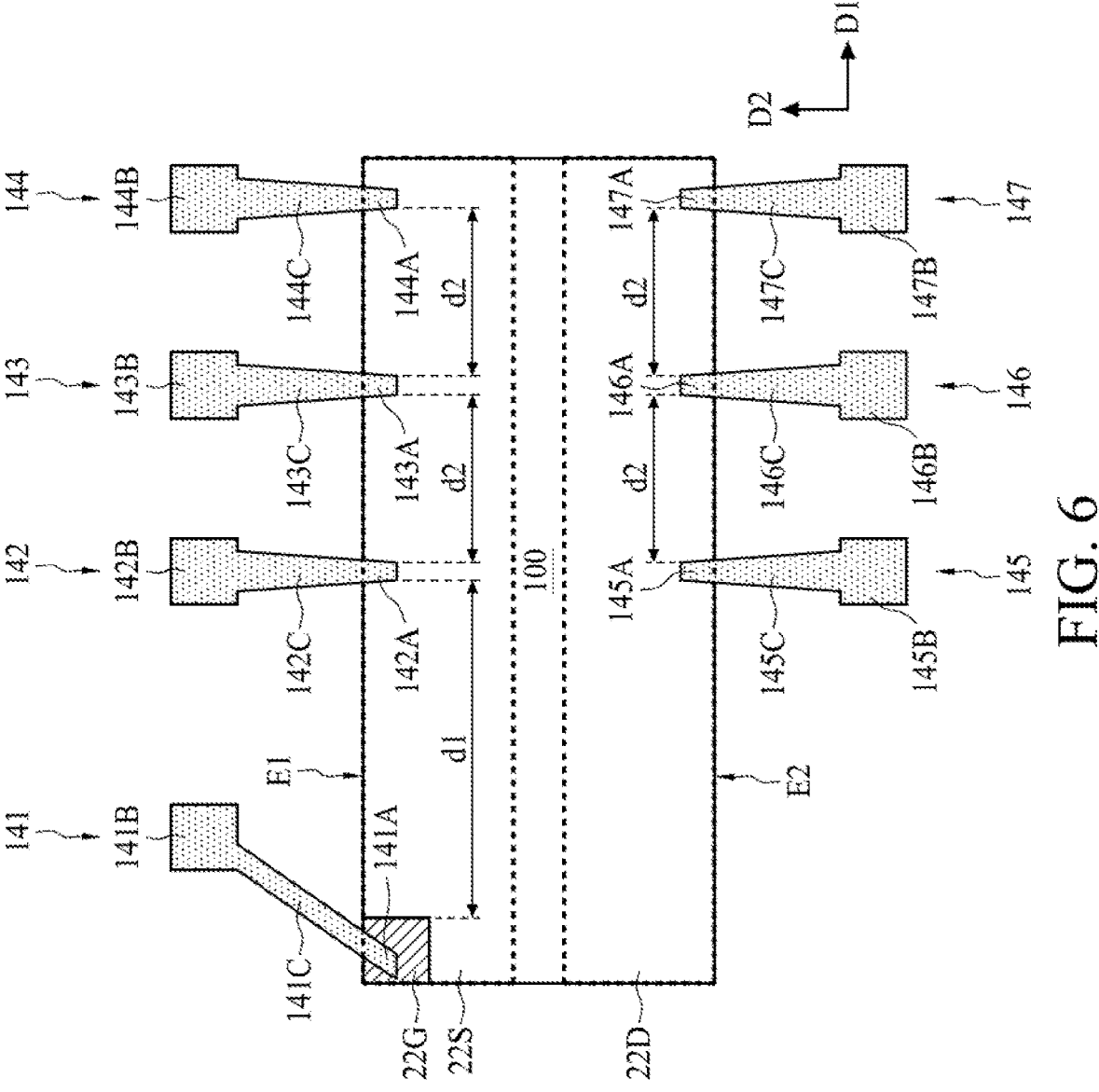
Figure 7:
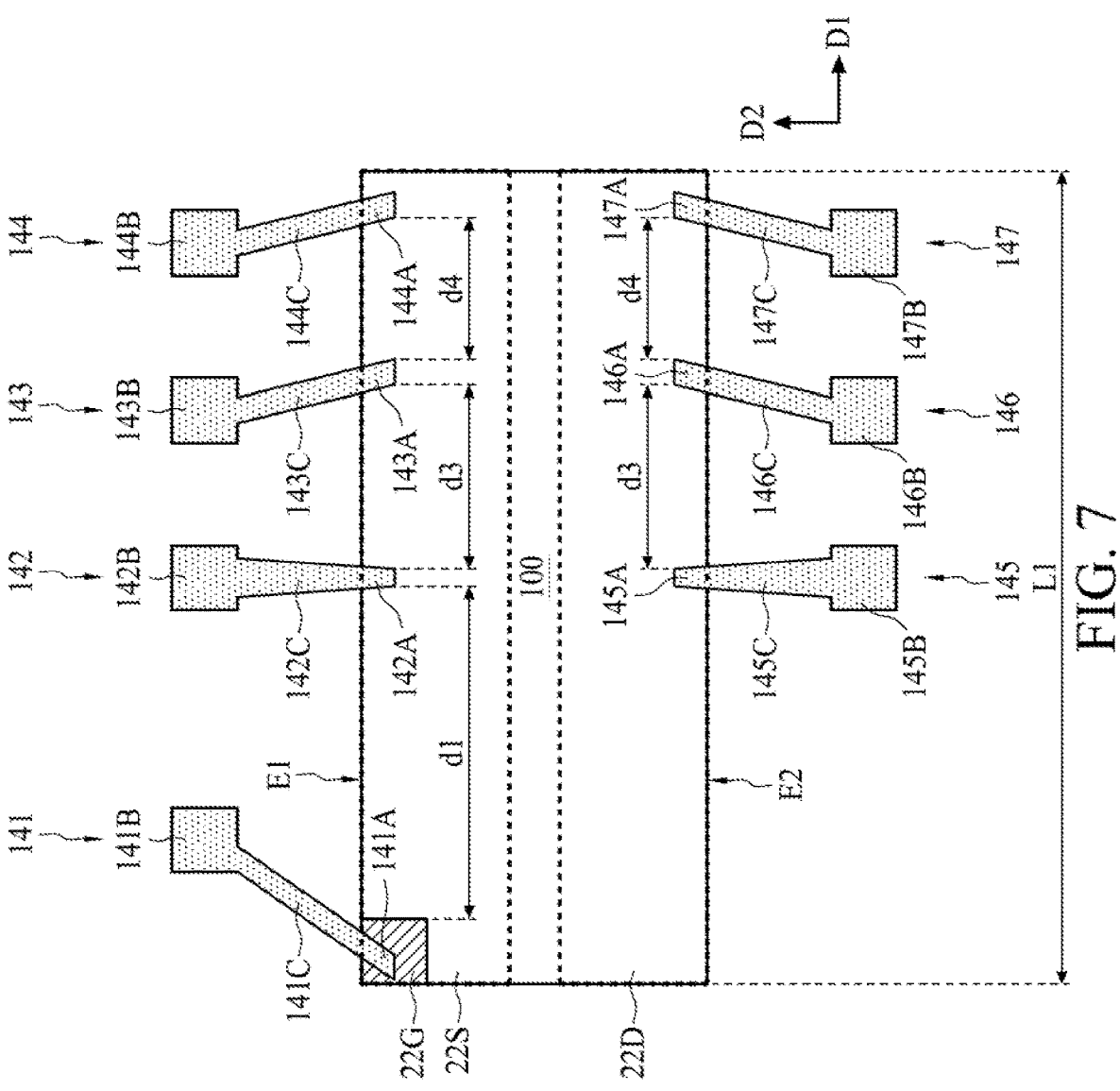

In operation 203, a plurality of metal features are formed on the semiconductor device 100, as shown in FIGS. 5 to 7. Referring to FIG. 5, in some embodiments, metal features 137 and 139 are respectively formed on the conductive vias 136, 138. The metal features 137, 139 may cover portions of the IMD 132. Portions of the top surface of the IMD 132 may not be covered by any metal features. The metal features such as 137 and 139 may be included in a second metal (M2) layer over the M1 layer. The M2 layer is a part of the interconnect structure 111 in FIG. 3. The semiconductor device 100 includes the M2 layer metal features 137, 139 and the like formed thereon. The metal features 137, 139 are continuation structures of the interconnect structure 111 in FIG. 3. The interconnect structure 111 including the metal features 137, 139 may use the same numeral 111. In some embodiments, the metal feature 139 is formed vertically on and electrically coupled to the first conductive via 136, and the metal feature 141 is formed vertically on and electrically coupled to the second conductive via 138. The metal features 137, 139 may extend along the second direction D2. A source terminal 10S may be formed of a stack of the source electrode 31, the source contact 131, the metal line 130, the first conductive via 136 and the metal feature 139. A drain terminal 10D may be formed of a stack of the drain electrode 41, the drain contact 133, the metal line 130, the second conductive via 138 and the metal feature 139. A gate terminal 10G may be formed of a stack of the gate electrode 21, the gate contact 121, the metal line 120 and additional wiring disposed on the metal line 120. The gate terminal 10G, the source terminal 10S and the drain terminal 10D may be used for electrical connections.

Referring to FIGS. 6 and 7, in some embodiments, test pads 141 to 147 are also formed. The plurality of metal features such as 137, 139 are electrically coupled to test pads 141 to 147. In some embodiments, each of the test pads 141 to 147 is an extension of the metal feature such as 137, 139. In some embodiments, the test pads 141 to 147 may be formed at the same time as the metal features 137, 139. In some embodiments, the test pads 141 to 147 are disposed at the same level (i.e., M2 layer) as the metal features 137, 139. The gate region 20G, the source region 20S and the drain region 20D including the M2 layer metal features disposed thereon may form a gate region 22G, a source region 22S and a drain region 22D, respectively. In some embodiments, the gate region 22G is disposed at a corner of the top surface of the semiconductor device 100 and surrounded by the source region 22S. In some embodiments, the source region 22S is adjacent to and parallel with the drain region 22D. In some embodiments, the test pads 141 to 147 extend from a periphery of a top surface of the semiconductor device 100. The first, second, third and fourth test pads 141 to 144 may be formed at a first top edge E1 of the semiconductor device 100. The fifth, sixth and seventh test pads 145 to 147 may be formed at a second top edge E2 of the semiconductor device 100. The first top edge E1 and the second top edge E2 are opposite to each other from a top-view perspective. In some embodiments, from a top-view perspective, the second test pad 142 is disposed opposite to and aligned with the fifth test pad 145, the third test pad 143 is disposed opposite to and aligned with the sixth test pad 146, and the fourth test pad 144 is disposed opposite to and aligned with the seventh test pad 147. In some embodiments, each of the test pads 141 to 147 includes a contact portion, a line portion and a probing portion. Using the first test pad 141 as an example, the first test pad 141 includes a first contact portion 141A and a first probing portion 141B that are connected by a first line portion 141C. The first contact portion 141A is embedded in the semiconductor device 100, and the first probing portion 141B is separated from the semiconductor device 100. In some embodiments, the first test pad 141 is electrically coupled to the gate region 22G. In some embodiments, the second test pad 142, the third test pad 143 and the fourth test pad 144 are electrically coupled to the source region 22S, and the fifth test pad 145, the sixth test pad 146 and the seventh test pad 147 are electrically coupled to the drain region 22D.

In some embodiments, a first distance d1 between the first contact portion 141A and the second contact portion 142A is about one half of the length L1 of the semiconductor device 100. In some embodiments, a second distance d2 between the second contact portion 142A and the third contact portion 143A, between the third contact portion 143A and the fourth contact portion 144A, between the fifth contact portion 145A and the sixth contact portion 146A or between the sixth contact portion 146A and the seventh contact portion 147A is about a quarter of the length L1 of the semiconductor device 100.

In some embodiments, the distances d2 and d3 are adjustable during the formation of the M2 layer metal features 139 to 147. According to different designs or applications of the semiconductor device 100, the semiconductor device 100 may have various sizes. As mentioned above, the length L1 is in a range between about 2000 µm and about 400 µm in some embodiments. Referring to FIGS. 6 and 7, in some embodiments, the second distances d2, which is between the second contact portion 142A and the third contact portion 143A and between the fifth contact portion 145A and the sixth contact portion 146A, are adjusted to a third distance d3 different from the distance d2. In such embodiments, the second distances d2, which is between the third contact portion 143A and the fourth contact portion 144A, and between the sixth contact portion 146A and the seventh contact portion 147A, are adjusted to a fourth distance d4 different from the distance d2. In some embodiments, the relative position between each of the probing portions 141B to 147B and the semiconductor device 100 is fixed. In such embodiments, as distances between either two of the contact portions 141A to 147A are varied, the line portions will be made correspondingly longer or shorter.

Figure 8:
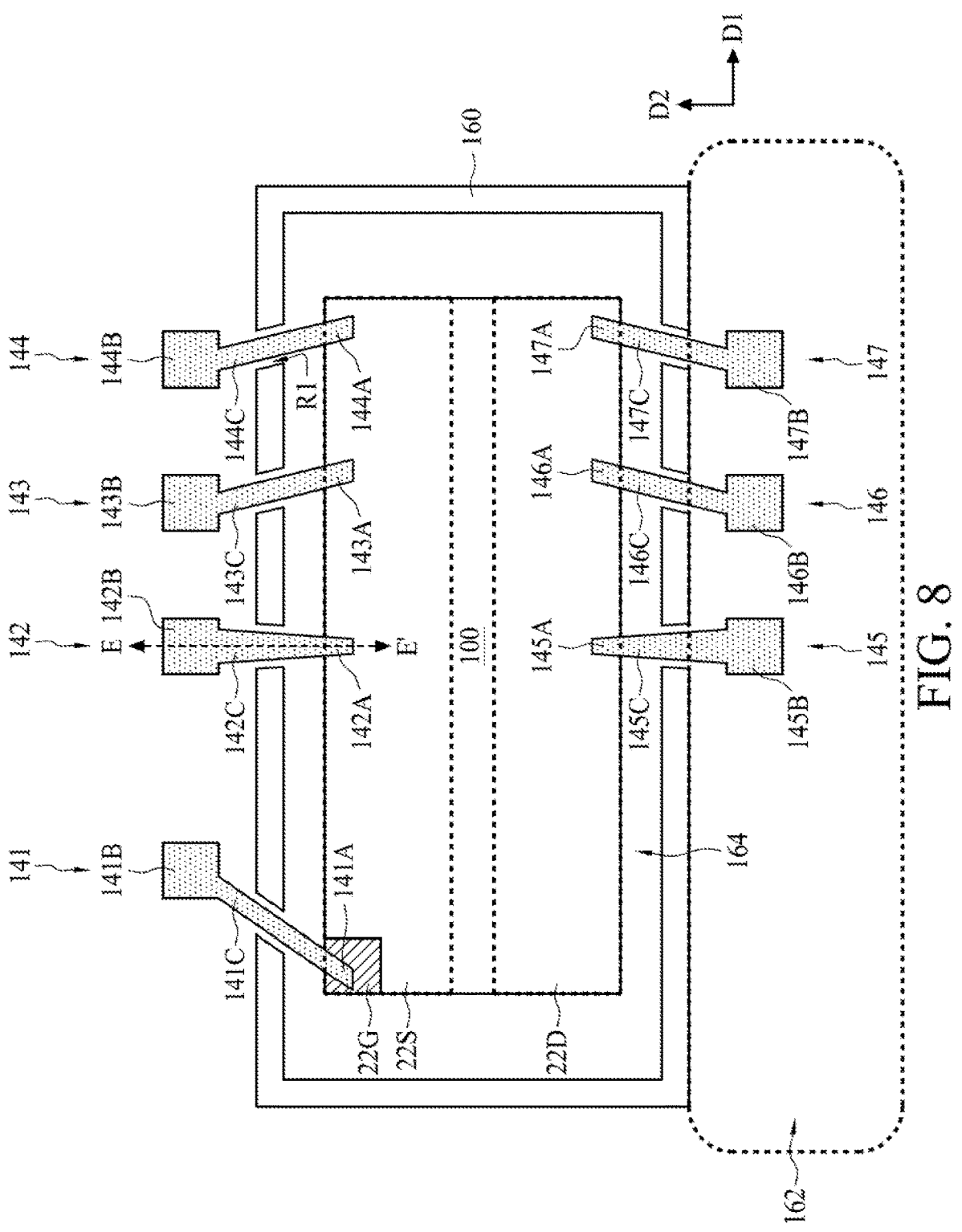

In operation 205, a seal ring structure 160 is formed surrounding the semiconductor device 100, as shown in FIGS. 8 to 11. Referring to FIG. 8, the seal ring structure 160 may electrically isolate the semiconductor device 100 from a scribe region 162 from a top-view perspective. An assembly isolation region 164 is between the semiconductor device 100 and the seal ring structure 160. The assembly isolation region 164 may be filled with a dielectric material. In some embodiments, the seal ring structure 160 includes multiple recesses or notches R1 that allow the line portions 141C to 147C of the test pads 141 to 147 to pass through. In some embodiments, the seal ring structure 160 is formed after the formation of the semiconductor device 100. In some other embodiments, the seal ring structure 160 is formed at the same time as the formation of the semiconductor device 100.

Figure 9:
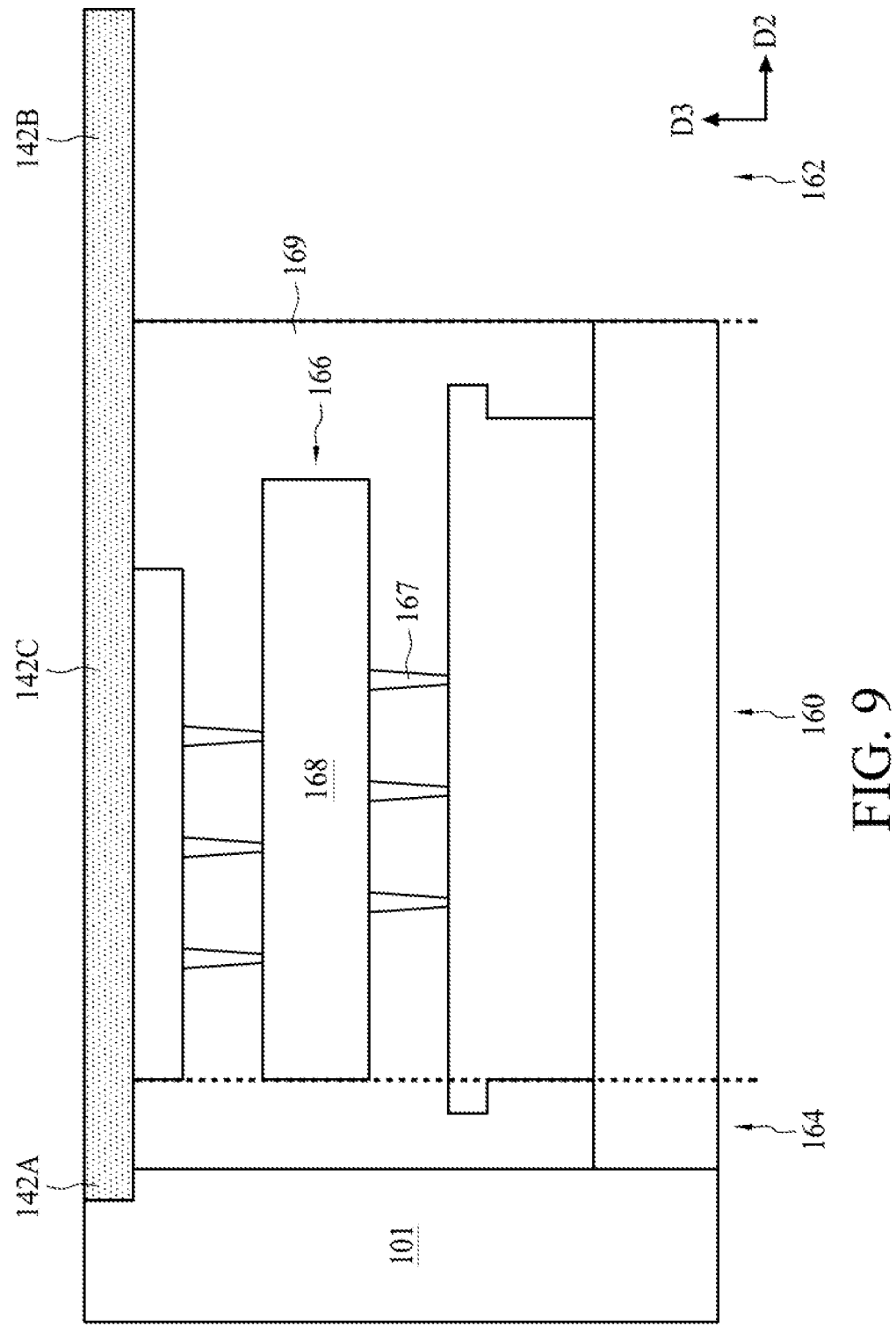
FIGS. 9 to 11 are schematic cross-sectional and perspective views showing portions of a seal ring structure that surrounds the semiconductor device formed in FIG. 8, in accordance with some embodiments of the present disclosure.

FIG. 9 is a schematic cross-sectional view showing portions of the seal ring structure 160 that surrounds the semiconductor device 100 along the cross-sectional line E-E' in FIG. 8. The seal ring structure 160 may include one or more interconnect structures 166 made of a plurality of vertically connected conductive vias 167 and conductive lines 168. The conductive vias 167 and lines 168 may be surrounded by a dielectric material 169.

Figure 10:
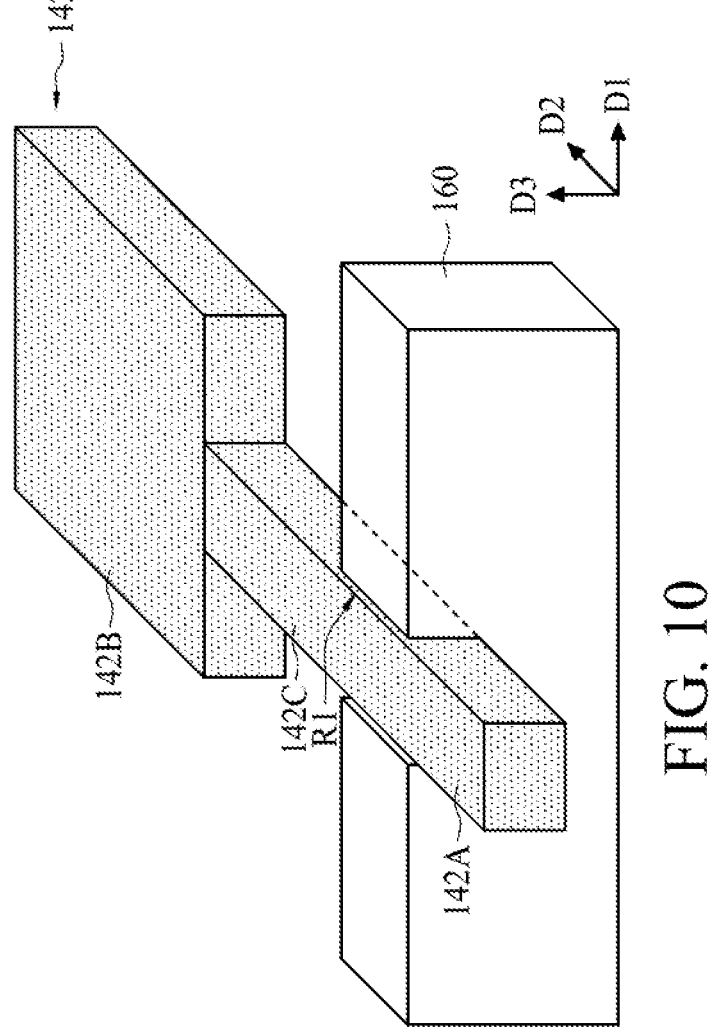

FIG. 10 is a schematic perspective view showing portions of the seal ring structure 160 that surrounds the semiconductor device 100. As illustrated as an example, FIG. 10 shows the second probing pad 142 passing through one of the recesses R1 of the seal ring structure 160. In some embodiments, the recess R1 is formed by recessing the seal ring structure 160 from a top portion of a sidewall of the seal ring structure 160.

Figure 11:
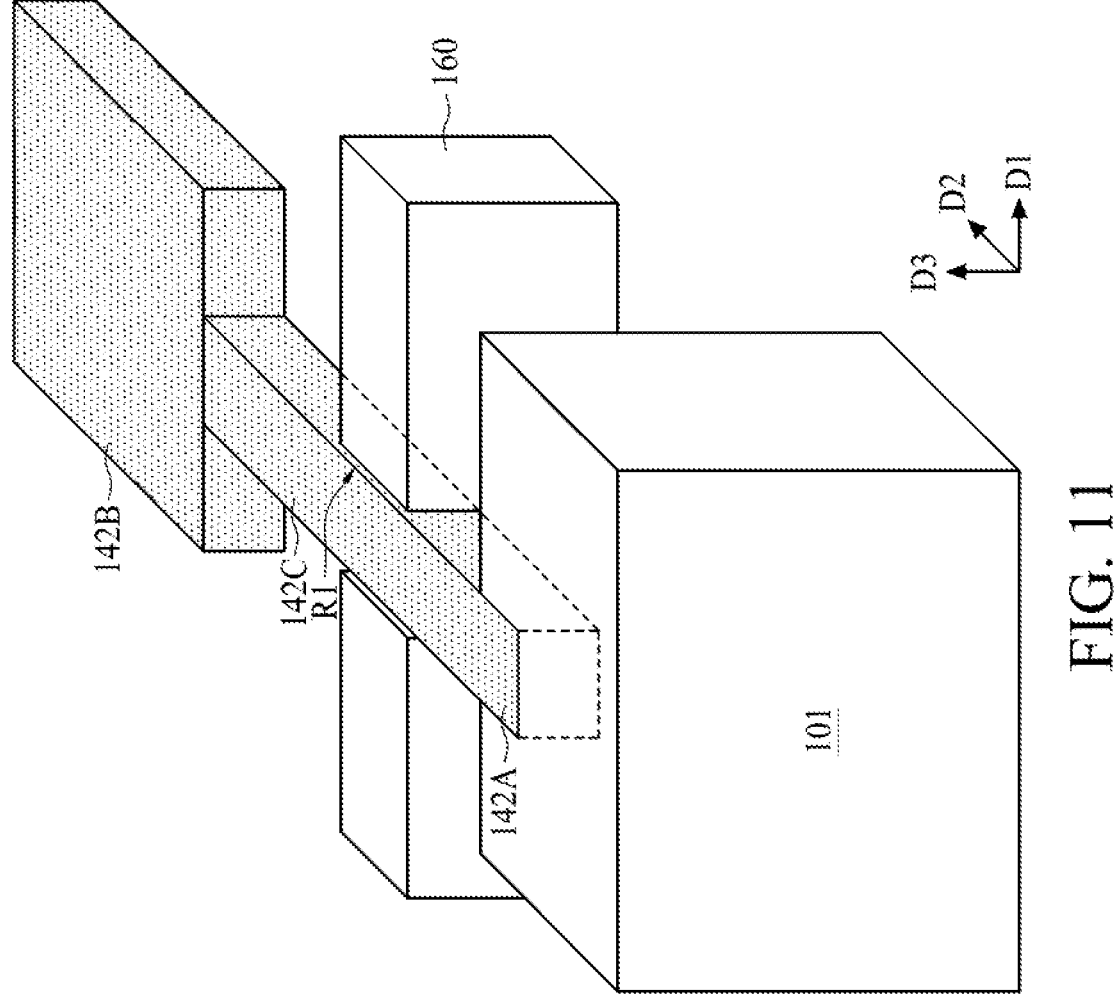

FIG. 11 is a schematic perspective view showing portions of the seal ring structure 160 that surrounds the semiconductor device 100. As illustrated as an example, FIG. 11 shows the second test pad 142 passing through the recess R1 and extends to the semiconductor device 100. The second contact portion 142A extends into and electrically couples to the semiconductor device 100.

Figure 12:
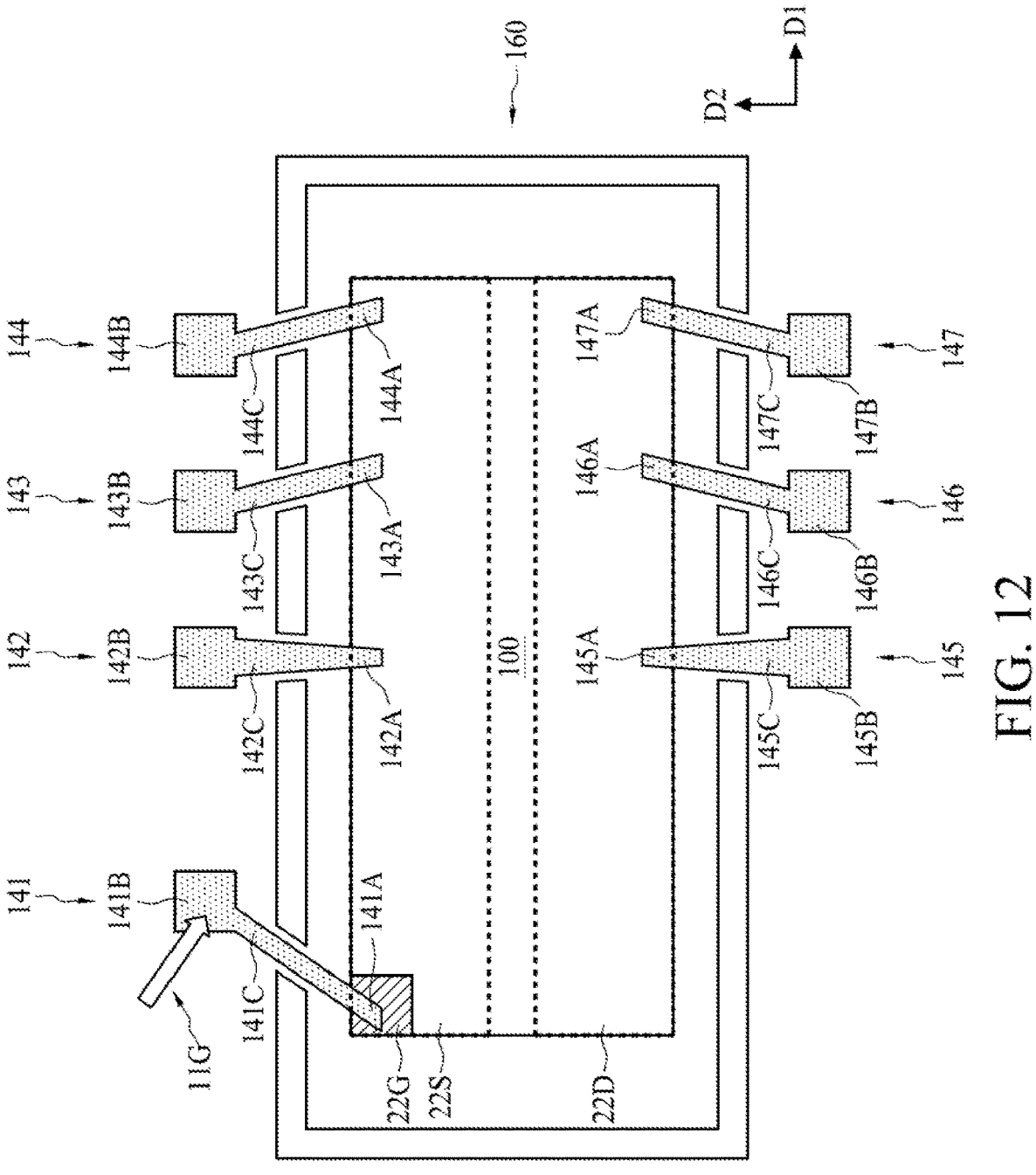
FIGS. 12 to 16 and 18 are schematic cross-sectional and perspective views illustrating sequential fabrication and testing stages of the semiconductor device formed using the method of FIG. 4, in accordance with some embodiments of the present disclosure.
Figure 13:
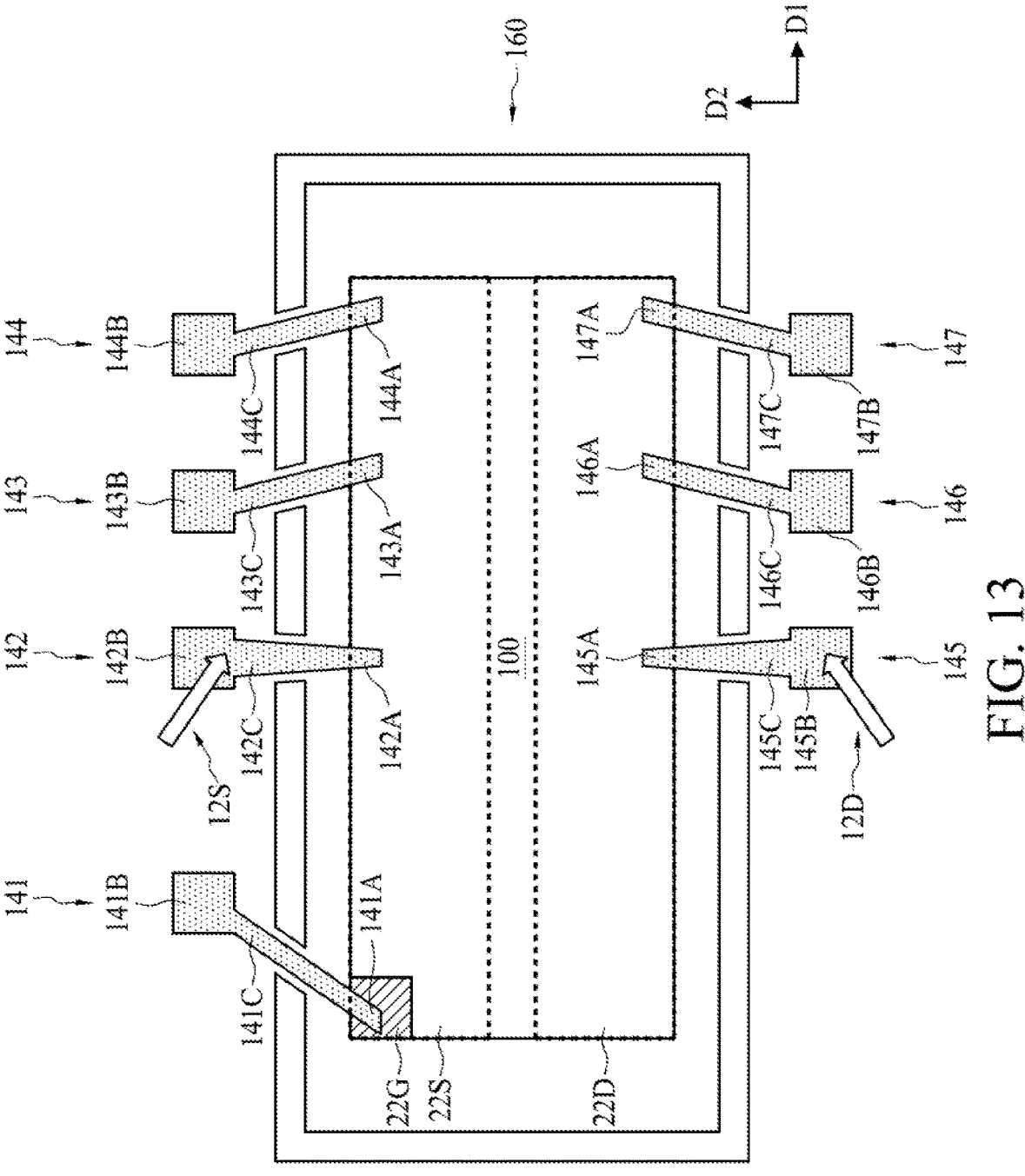
Figure 14:
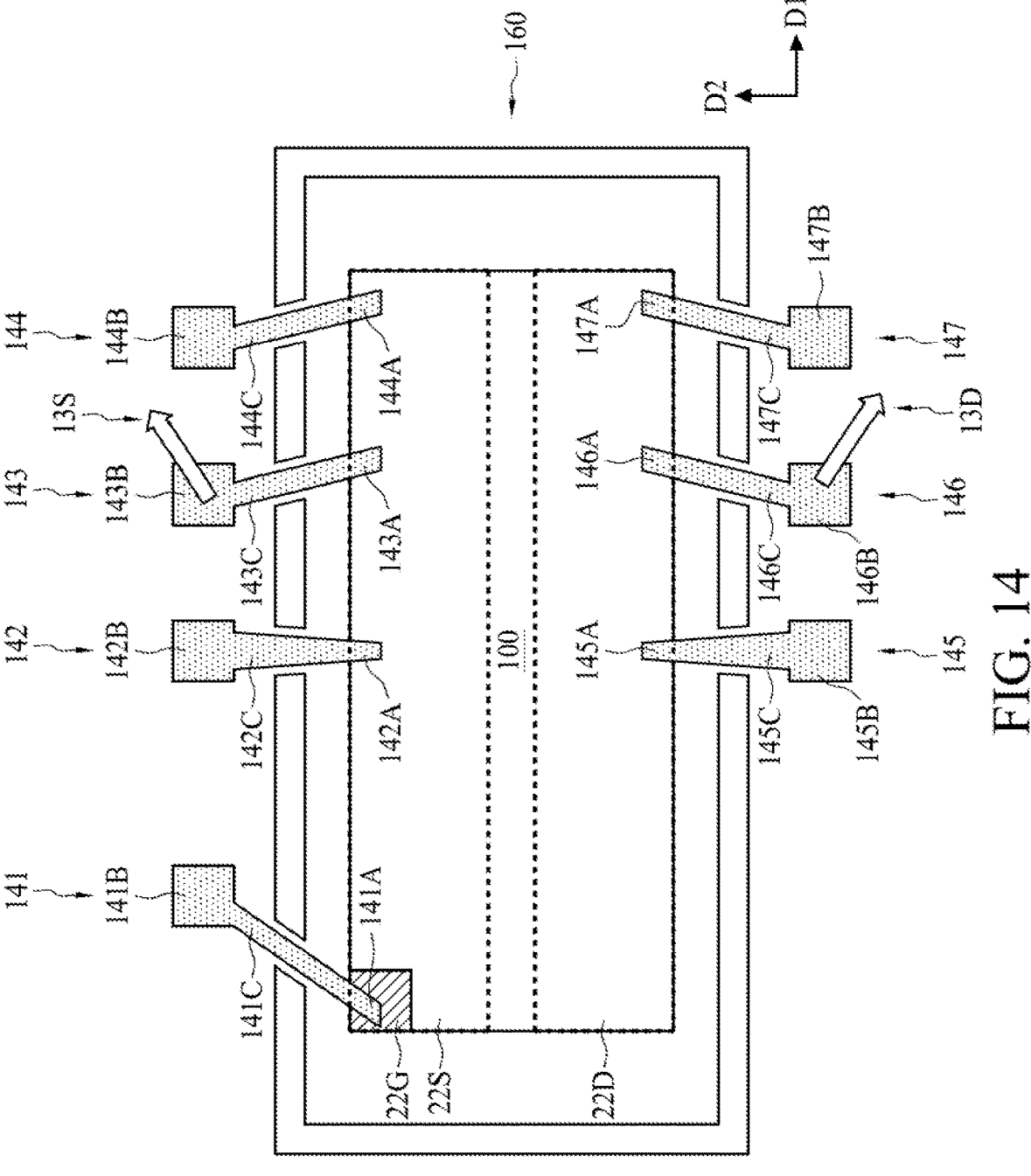

In operation 207, an electrical testing operation is performed on the semiconductor device 100, as shown in FIGS. 12 to 14. In some embodiments, the order of the operation 207 and the operation 205 can be exchanged. That is, the electrical testing operations performed before the formation of the seal ring structure 160. In some embodiments, the electrical testing operation is a wafer-level reliability test or a wafer acceptance test (WAT) using the test pads 141 to 147 formed on the semiconductor device 100.

Referring to FIG. 12, a driving signal 11G is applied to the gate region 22G through the first test pad 141. The driving signal includes a voltage level of at least equal to the threshold voltage of the transistors of the semiconductor device 100 turn on theses transistors.

Referring to FIG. 13, a first input signal 12S is applied to the source region 22S through the second test pad 142, and a second input signal 12D is applied to the drain region 22D through the fifth test pad 145. In some embodiments, the first input signal 12S is a ground voltage (VSS) and the second input signal 12D is a power supply voltage (VDD). The first input signal 12S and the second input signal 12D may cause a current to flow through the source region 22S and the drain region 22D.

Referring to FIG. 14, a first sensing signal 13S and a second sensing signal 13D are measured from the third test pad 143 and the sixth test pad 146. A first electrical parameter regarding the semiconductor device 100 may be obtained by comparing the first input signal 12S and the first sensing signal 13S, and a second electrical parameter regarding the semiconductor device 100 may be obtained by comparing the second input signal 12D and the second sensing signal 13D. The first and second electrical parameters may be voltages, currents, resistances, a combination thereof, or the like.

In some embodiments, the test pads 141 to 147 are regarded extension parts of the M2 metal features that are used in the testing operation. The test pads 142 and 145 may be referred to as force pads for inputting testing signals. The test pads 143 and 146 may be referred to as sense pads for outputting sensing signals. The test pads 144 and 147 may be dummy pads used for a monitoring operation or backup pads for inputting or outputting a signal. Positions of the dummy pads or backup pads may be adjusted. For example, the fourth test pad 144 may be disposed between the first test pad 141 and the second test pad 142, and in the meantime the seventh test pad 147 is correspondingly disposed between the fifth test pad 145 and the sixth test pad 146. The placement flexibility of the test pads 141 to 147 may increase the accuracy of the wafer-level test performed on the semiconductor device 100 for different dimensions of the semiconductor device 100.

Figure 15:
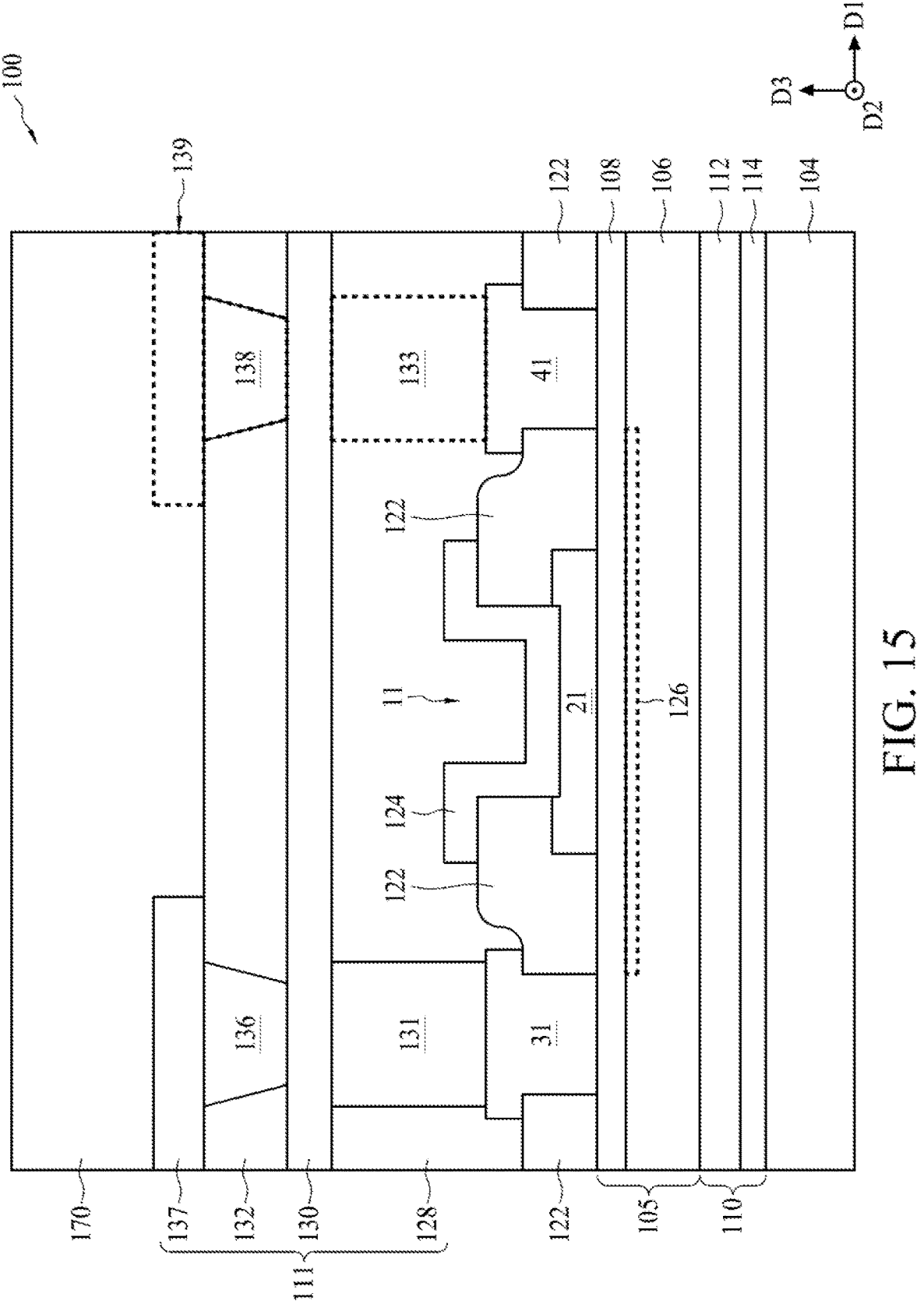

In operation 209, a passivation layer 170 is formed on the semiconductor device 100, as shown in FIG. 15. The passivation layer 170 is formed on the semiconductor device 100 as an example. In some embodiments, the passivation layer 170 is at least partially disposed on the metal features 137, 139 and over the IMD 132. In some other embodiments, the passivation layer 170 has openings that expose portions of metal features 137, 139 and the test pads 141 to 144. The passivation layer 170 may be made of aluminum nitride (AlN) or boron nitride (BN).

Figure 16:
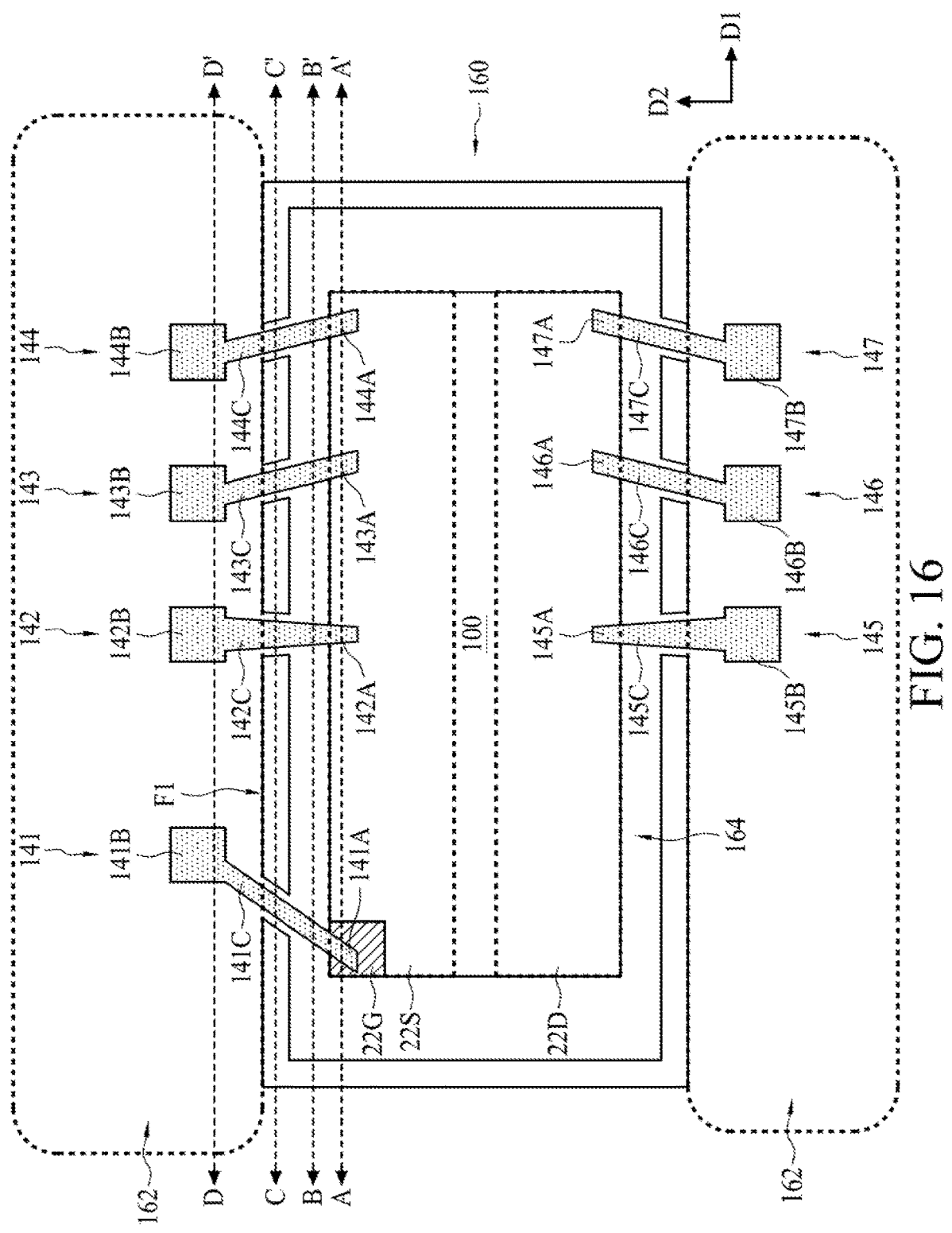
Figure 18:
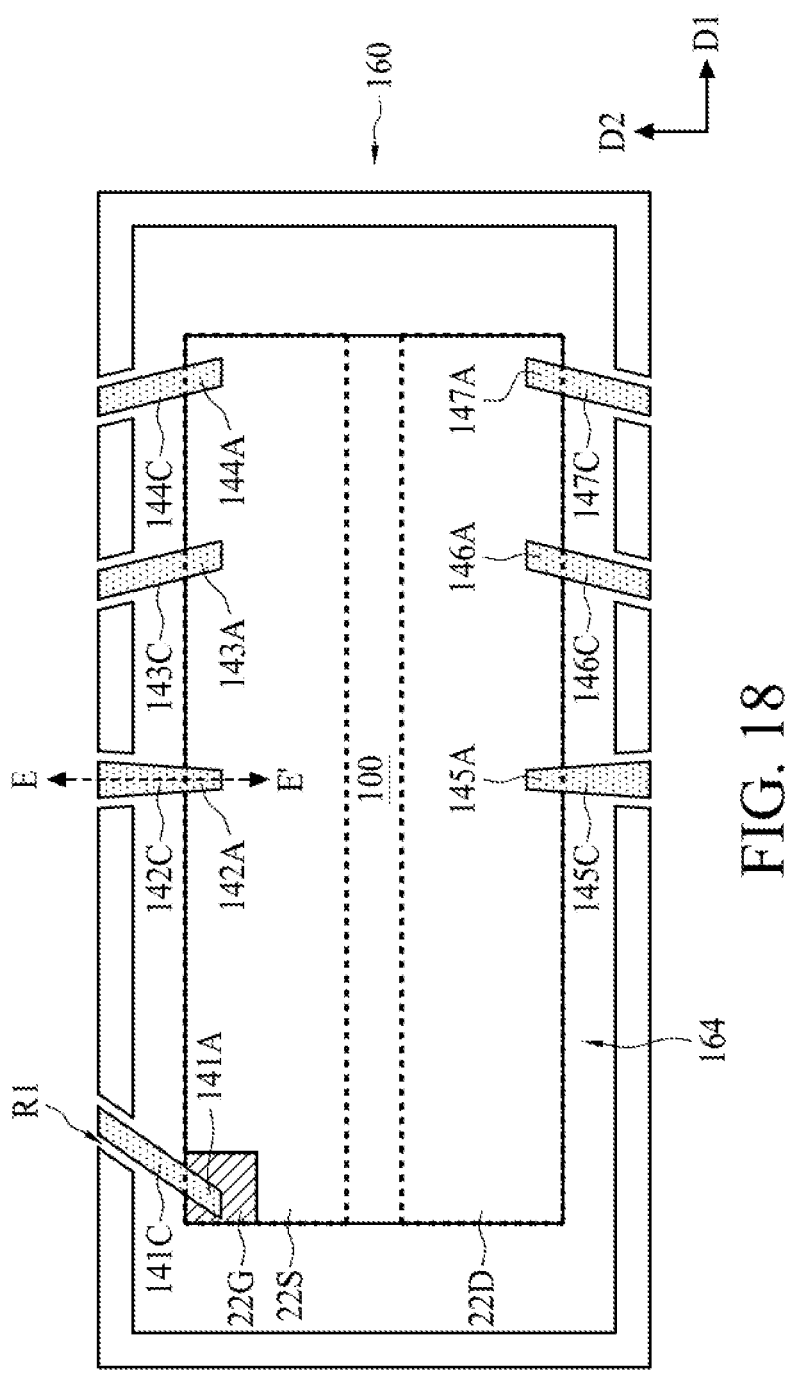

In operation 211, a dicing or scribe operation is performed on the semiconductor device 100, as shown in FIGS. 16 and 18. In some embodiments, the dicing operation is a process by which a plurality of semiconductor devices 10 are separated from a wafer of semiconductor. The dicing operation may be accomplished by mechanical sawing by laser cutting. Referring to FIG. 16, after the testing and manufacturing of the semiconductor device 100 is completed, the wafer including the semiconductor device 100 may be subject to the dicing operation. The dicing operation may be executed along scribe regions 162 on the wafer. The scribe regions 162 may extend along edges F1 of the seal ring structure 160.

FIGS. 17A to 17D are various schematic cross-sectional views along different cross-sectional lines of the semiconductor device 100 formed in FIG. 16. Some elements of the semiconductor device 100 may be omitted for simplicity.

Figures 17A, 17B, 17C, 17D:
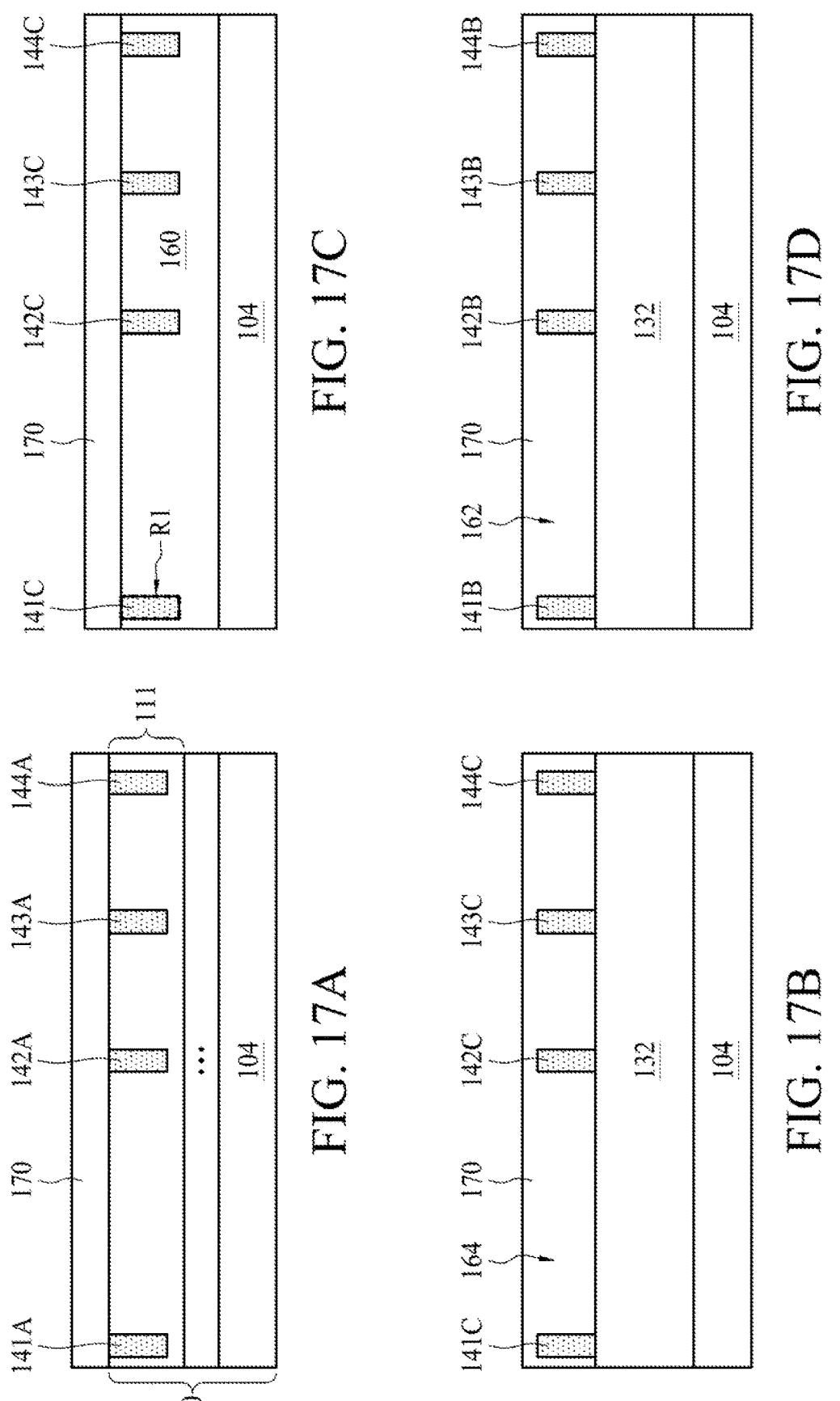
FIGS. 17A to 17D are various schematic cross-sectional views along different cross-sectional lines of the semiconductor device formed in FIG. 16, in accordance with some embodiments of the present disclosure.

FIG. 17A is a schematic cross-sectional view along the cross-sectional line A-A' in FIG. 16. FIG. 17A shows the semiconductor device 100 includes the substrate 104, the interconnect structure 111 and the contact portions 141A to 144A of the test pads 141 to 144. The contact portions 141A to 144A and the interconnect structure 111 are over the substrate 104. The passivation layer 170 may cover the interconnect structure 111 and the contact portions 141A to 144A.

FIG. 17B is a schematic cross-sectional view along the cross-sectional line B-B' in FIG. 16. FIG. 17B shows the line portions 141C to 144C of the test pads 141 to 144, respectively, over the IMD 132 in the assembly isolation region 164.

FIG. 17C is a schematic cross-sectional view along the cross-sectional line C-C' in FIG. 16. Referring to FIG. 17C, each of the line portions 141C to 144C passes through a recess or a notch R1 of the seal ring structure 160. The detailed structure of the seal ring structure 160 in FIG. 17C may be referred to FIG. 9. In some embodiments, the line portions 141C to 144C are separated from the conductive vias 167 or the conductive lines 168 by the dielectric material 169.

FIG. 17D is a schematic cross-sectional view along the cross-sectional line D-D' in FIG. 16. FIG. 17D shows the test portions 141B to 144B of the test pads 141 to 144, respectively, over the IMD 132 in the scribe region 162. The test portions 141B to 144B may be removed after the dicing operation.

Referring to FIG. 18, after the wafer is diced, portions of the test pads 141 to 147 may be removed. In some embodiments, portions of the test pads 141 to 147 originally formed in the scribe regions 162 are removed during the dicing operation of the wafer. In some embodiments, portions of the lines portions 141C to 147C remain on the recesses R1 of the seal ring structure 160 after the dicing operation. In some embodiments, the contact portions 141A to 147A remain in the semiconductor device 100 after the dicing operation. In some embodiments, an edge of each of the remained test pad 141 to 147 is flush with an edge F1 or F2 of the seal ring structure 160 after the dicing operation.

Figure 19:
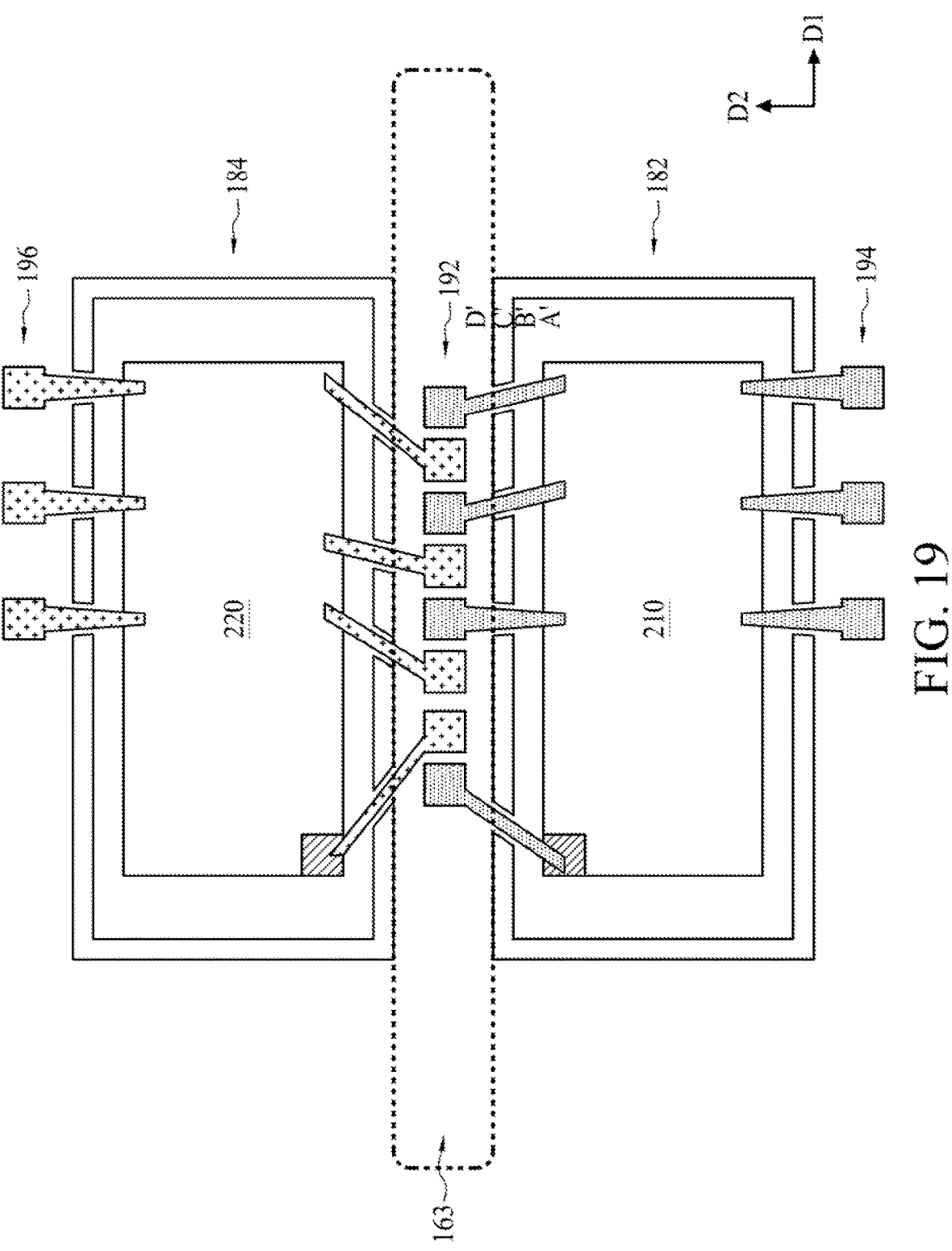
FIG. 19 is a schematic top view of two semiconductor devices including test pads, in accordance with some embodiments of the present disclosure.

FIG. 19 is a schematic top view of two semiconductor devices 210 and 220 including test pads. In some embodiments, the semiconductor devices 210 and 220 are HEMT device. The semiconductor device 210 is surrounded by a first seal ring structure 182 and the semiconductor device 220 is surrounded by a second seal ring structure 184. A first set 192 of test pads is disposed in a scribe region 163 between the first seal ring structure 182 and the second seal ring structure 184. A second set 194 of test pads is disposed on one side of the seal ring structure 182 and a third set 196 of test pads is disposed on the other side of the seal ring structure 184.

Figure 20:
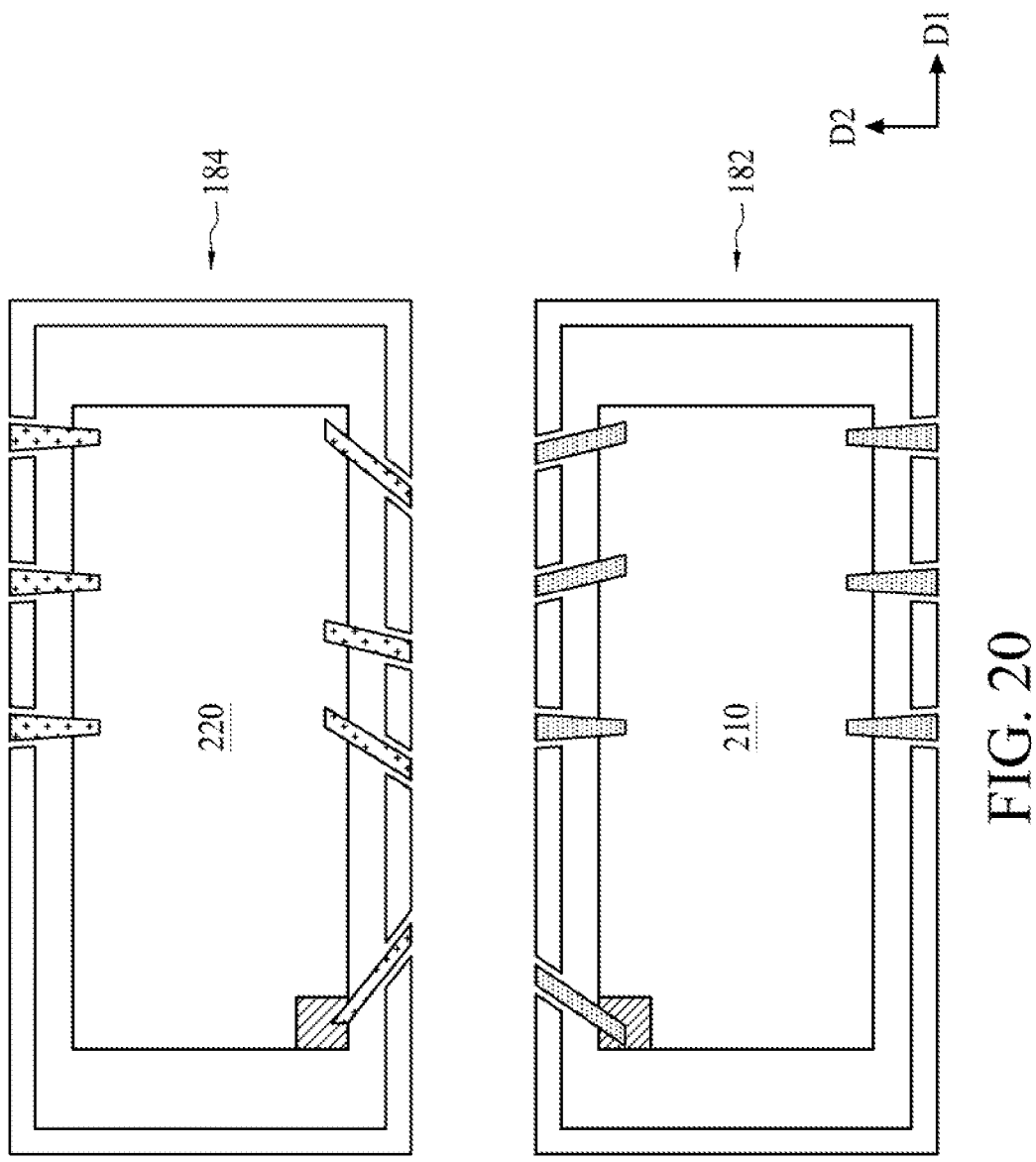
FIG. 20 is a schematic top view showing the two semiconductor devices in FIG. 19 after a dicing operation, in accordance with some embodiments of the present disclosure.

FIG. 20 is a schematic top view showing the two semiconductor devices 210 and 220 after a dicing operation. Portions of the first set 192, the second set 194 and the third set 196 of test pads are removed, as shown in FIG. 20. The other portions of the first set 192, the second set 194 and the third set 196 of test pads remain within the seal ring structures 182 and 184.

The present disclosure provides a method of forming testing signal terminals and sensing signal terminals (e.g., the contact portions 141A to 147A) during the formation of the metal features in the same metal layer (e.g., M2 layer). Compared with manual testing of HEMT devices, the formation of the testing signal terminals and the sensing signal terminals on the HEMT devices is incorporated into the manufacturing process of a certain metal (e.g., M2) layer over the transistors. The testing signal terminals and sensing signal terminals are connected to the gate pad, source pad and drain pad after the formation of the metal layer metal features. Therefore, no further alignment operation is required for testing/probing operations. In addition, relative positions or distances of the contact portions 141A to 147A may be adjusted. The wafer-level WAT or reliability test may thus be more precise, efficient and comprehensive using the testing method and structure proposed in the present disclosure.

One aspect of the present disclosure provides a method of performing an electrical test on a semiconductor wafer. The method includes: receiving the semiconductor wafer including a semiconductor device, wherein the semiconductor device includes a transistor having a gate terminal, a source terminal and a drain terminal; forming an interconnect structure over the transistor; forming a metal pattern over the interconnect structure, the metal pattern including: a first pad, a second pad and a third pad at a first top edge of the semiconductor device; and a fourth pad and a fifth pad at a second top edge of the semiconductor device, wherein the first pad, the second pad and the third pad are electrically coupled to the gate terminal, the source terminal and the drain terminal, respectively, the second top edge is opposite to the first top edge from a top-view perspective, the second pad is disposed opposite to the fourth pad from a top-view perspective, and the third pad is disposed opposite to the fifth pad from a top-view perspective, applying a driving signal to the first pad to turn on the transistor; applying a first input signal to the second pad to obtain a first sensing signal of the source terminal from the third pad and applying a second input signal to the fourth pad to obtain a second sensing signal of the drain terminal from the fifth pad.

One aspect of the present disclosure provides another method of performing an electrical test on a semiconductor wafer. The method includes: receiving the semiconductor wafer including a first device and a second device neighboring to the first device, wherein the first device is surrounded by a first seal ring and the second device is surrounded by a second seal ring; forming a first set of openings on a sidewall of the first seal ring and a second set of openings on a sidewall of the second seal ring; forming a test metal pattern between the first device and the second device, wherein the test metal pattern includes a first set of lines extending into a first top edge of the first device and a second set of lines extending into a second top edge of the second device facing the first top edge, wherein the test metal pattern further includes a first set of probing portions electrically coupled to the respective first set of lines and a second set of probing portions electrically coupled to the respective second set of lines; and respectively applying a first electrical signal to the first set of pads to obtain a first electrical parameter associated with the first device and applying a second electrical signal to the second set of pads to obtain a second electrical parameter associated with the second device.

Another method of the disclosure provides a semiconductor device. The semiconductor device includes a substrate including a transistor, wherein the semiconductor device is surrounded by a seal ring; an interconnect structure over the transistor; a recess on a sidewall of the seal ring; and a test pad in the interconnect structure, wherein the test pad extends from the interconnect structure to the recess of the seal ring.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present invention. Accordingly, the appended claims are intended to include within their scope such processes, machines, manufacture, compositions of matter, means, methods and steps.

What is claimed is:

1. A method of performing an electrical test on a semiconductor wafer, the method comprising:

receiving the semiconductor wafer including a semiconductor device, wherein the semiconductor device includes a transistor having a gate terminal, a source terminal and a drain terminal;

forming an interconnect structure over the transistor;

forming a metal pattern over the interconnect structure, the metal pattern including:

a first pad, a second pad and a third pad at a first top edge of the semiconductor device; and a fourth pad and a fifth pad at a second top edge of the semiconductor device, wherein the first pad, the second pad and the third pad are electrically coupled to the gate terminal, the source terminal and the drain terminal, respectively, the second top edge is opposite to the first top edge from a top-view perspective, the second pad is disposed opposite to the fourth pad from a top-view perspective, and the third pad is disposed opposite to the fifth pad from a top-view perspective, applying a driving signal to the first pad to turn on the transistor;

applying a first input signal to the second pad to obtain a first sensing signal of the source terminal from the third pad; and applying a second input signal to the fourth pad to obtain a second sensing signal of the drain terminal from the fifth pad.

2. The method of claim 1, wherein the metal pattern further includes a sixth pad and a seventh pad for receiving or inputting electrical signals, the sixth pad being disposed opposite to the seventh pad from a top-view perspective.

3. The method of claim 1, wherein during the forming of the metal pattern, a distance between the first pad and the third pad or between the second pad and the third pad is adjustable.

4. The method of claim 1, further comprising:

comparing the first input signal and the first sensing signal to obtain a first electrical parameter regarding the semiconductor device, and comparing the second input signal and the second sensing signal to obtain a second electrical parameter regarding the semiconductor device.

5. The method of claim 4, wherein the first and second electrical parameters are expressed in terms of voltage, current, resistance or a combination thereof.

6. The method of claim 1, further comprising forming a passivation layer over the metal pattern.

7. The method of claim 6, further comprising dicing the semiconductor wafer after the forming of the passivation layer, wherein after the dicing of the semiconductor wafer, portions of the metal pattern remain over the semiconductor device.

8. A method of performing an electrical test on a semiconductor wafer, the method comprising:

receiving the semiconductor wafer including a first device and a second device adjacent to the first device, wherein the first device is surrounded by a first seal ring and the second device is surrounded by a second seal ring;

forming a first set of openings on the first seal ring and a second set of openings on the second seal ring;

forming a test metal pattern between the first device and the second device, wherein the test metal pattern includes a first set of lines extending into a first top edge of the first device and a second set of lines extending into a second top edge of the second device facing the first top edge, wherein the test metal pattern further includes a first set of probing portions electrically coupled to the respective first set of lines and a second set of probing portions electrically coupled to the respective second set of lines; and applying a first electrical signal to the first set of pads to obtain a first electrical parameter associated with the first device and applying a second electrical signal to the second set of pads to obtain a second electrical parameter associated with the second device.

9. The method of claim 8, wherein the first set of lines extend through the first set of openings and the second set of lines extend through the second set of openings.

10. The method of claim 8, further comprising separating the first device and the second device by dicing the semiconductor wafer, wherein after the first device and the second device are separated, portions of the first set of lines remain in the first device and portions of the second set of lines remain in the second device.

11. The method of claim 10, wherein during the dicing of the semiconductor wafer, the first set of probing portions are separated from the first set of lines, and the second set of probing portions are separated from the second set of lines.

12. The method of claim 10, wherein during the dicing of the semiconductor wafer, at least portions of the first set of lines remain in the first device and at least portions of the second set of lines remain in the second device.

13. The method of claim 8, wherein the first device or the second device includes a III-V high electron mobility transistor (HEMT).

14. The method of claim 8, wherein the metal test pattern is electrically connected to a gate electrode, a source electrode or a drain electrode of the first device or the second device.

15. The method of claim 8, wherein during the applying of the first and second electrical signals, the first and second sets of probing portions are outside the first seal ring and the second seal ring.

16. The method of claim 8, wherein the test metal pattern includes a dummy pad for inputting a third electrical signal or outputting a fourth electrical signal.

17. A method of performing an electrical test on a semiconductor wafer, the method comprising:

forming a semiconductor device on a wafer, wherein the semiconductor device includes a transistor having a gate terminal, a source terminal and a drain terminal;

forming an interconnect structure over the semiconductor device, the interconnect structure comprising a seal ring laterally surrounding the semiconductor device from a top-view perspective;

forming a metal pattern in the interconnect structure and overlapping the seal ring, the metal pattern including:

a first pad, a second pad and a third pad at a first top edge of the semiconductor device; and a fourth pad and a fifth pad at a second top edge of the semiconductor device, wherein the second top edge is opposite to the first top edge from a top-view perspective.

18. The method of claim 17, further comprising:

applying a driving signal to the first pad to turn on the semiconductor device;

providing a first input signal to the second pad to receive a first sensing signal from the third pad; and providing a second input signal to the fourth pad to receive a second sensing signal from the fifth pad.

19. The method of claim 17, further comprising dicing the wafer and leaving portions of the metal pattern within an enclosure of the seal ring.

20. The method of claim 17, wherein the semiconductor device comprises a plurality of gate electrodes electrically connected to the first pad, a plurality of source electrodes electrically connected to the second pad, and plurality of drain electrodes electrically connected to the third pad.

* * * * *